(12) United States Patent
Kumar et al.

(10) Patent No.: US 7,399,676 B2
(45) Date of Patent: Jul. 15, 2008

(54) SILICON CARBIDE SEMICONDUCTOR DEVICE AND METHOD FOR MANUFACTURING THE SAME

(75) Inventors: Malhan Rajesh Kumar, Nagoya (JP); Yuichi Takeuchi, Obu (JP)

(73) Assignee: DENSO CORPORATION, Kariya (JP)

( * ) Notice: Subject to any disclaimer, the term of this patent is extended or adjusted under 35 U.S.C. 154(b) by 325 days.

(21) Appl. No.: 11/268,612

(22) Filed: Nov. 8, 2005

(65) Prior Publication Data

US 2006/0097267 A1 May 11, 2006

(30) Foreign Application Priority Data

Nov. 8, 2004 (JP) ............... 2004-323514

(51) Int. Cl.
*H01L 21/336* (2006.01)
*H01L 21/8242* (2006.01)

(52) U.S. Cl. ............... 438/268; 438/243; 257/E21.054; 257/E21.115

(58) Field of Classification Search ............... 438/268, 438/243, 569; 257/E21.182, E21.065, E21.115, 257/E21.054, E21.055, E21.129, E21.102
See application file for complete search history.

(56) References Cited

U.S. PATENT DOCUMENTS

| | | | |
|---|---|---|---|
| 5,637,898 A | | 6/1997 | Baliga |
| 6,570,185 B1 | | 5/2003 | Tan |
| 2005/0282393 A1 | * | 12/2005 | Cheng et al. ............... 438/700 |
| 2006/0097267 A1 | * | 5/2006 | Kumar et al. ............... 257/77 |
| 2006/0124936 A1 | * | 6/2006 | Cheng et al. ............... 257/71 |
| 2006/0166433 A1 | * | 7/2006 | Kim et al. ............... 438/243 |

OTHER PUBLICATIONS

Chung et al., "Effect of nitric oxide annealing on the interface trap densities near the band edges in the 4H polytype of silicon carbide." *Applied Physics Letters*, vol. 76, No. 13, pp. 1713-1715, Mar. 2000.
Xu et al., "Improved Performance and Reliability of N2O-Grown Oxy-nitride on 6H-SiC." *IEEE Electron Device Letters*, vol. 21, No. 6, pp. 298-300, Jun. 2000.
Um et al., "MOS Interface Research." *MOS Interface Research at Purdue* Jan. 20, 2001: pp. 1-6. Purdue WBG. Nov. 22, 2005 http://www.ecn.purdue.edu/WBG/Basic_Measurements/MOSInterface/Index.html.

* cited by examiner

*Primary Examiner*—Walter L Lindsay, Jr.
(74) *Attorney, Agent, or Firm*—Posz Law Group, PLC

(57) ABSTRACT

A method for manufacturing a silicon carbide semiconductor device includes the steps of: preparing a semiconductor substrate including a silicon carbide substrate and first to third semiconductor layers; forming a trench in a cell region of the semiconductor substrate; forming a fourth semiconductor layer in the trench; forming an oxide film in the trench such that a part of the fourth semiconductor layer on a sidewall of the trench is thermally oxidized; forming a gate electrode on the oxide film in the trench; forming a first electrode electrically connecting to the third semiconductor layer; and forming a first electrode electrically connecting to the silicon carbide substrate.

16 Claims, 24 Drawing Sheets

US 7,399,676 B2

SILICON CARBIDE SEMICONDUCTOR DEVICE AND METHOD FOR MANUFACTURING THE SAME

CROSS REFERENCE TO RELATED APPLICATION

This application is based on Japanese Patent Application No. 2004-323514 filed on Nov. 8, 2004, the disclosure of which is incorporated herein by reference.

FIELD OF THE INVENTION

The present invention relates to a silicon carbide semiconductor device and method for manufacturing a silicon carbide semiconductor device.

BACKGROUND OF THE INVENTION

SiC is excellent as a semiconductor material in physical properties and electric properties in comparison with silicon of the main current at present. Concretely, a forbidden band width is three times and an insulation breakdown electric field is 7 times and the coefficient of thermal conductivity is three times larger than those of silicon, respectively. Therefore, SiC is expected as a semiconductor material for realizing a high power and super low loss element of the next generation.

For example, there is a structure shown in U.S. Pat. No. 6,570,185 as a vertical type power MOSFET of a trench type using this SiC. FIG. 44 shows the sectional construction of this power MOSFET.

As shown in FIG. 44, in the power MOSFET, an $N^-$ type drift layer 102 is formed on the surface of an $N^+$ type SiC substrate 101. An N type area 103 and a $P^+$ type base area 104 are sequentially formed on the $N^-$ type drift layer 102. An $N^+$ type source area 105 is formed in a surface layer portion of the $P^+$ type base area 104. Further, a trench 106 is formed so as to extend through the $N^+$ type source area 105, the $P^+$ type base area 104 and the N type area 103 and to reach the $N^-$ type drift layer 102. A gate electrode 108 is formed within this trench 106 through a gate oxide film 107. A $P^+$ type layer 109 is formed on the bottom face of the trench 106.

In the vertical type power MOSFET as a trench type MOSFET, impurities are generally doped into the gate oxide film 107. An interface level density at the interface of the gate oxide film 107 and SiC, or a fixing electric charge density within the gate oxide film 107 can be reduced by such doping of the impurities. Thus, performance, reliability, etc. of the power MOSFET can be improved.

Here, for example, N (i.e., nitrogen) is used as the impurities doped to the gate oxide film 107 as mentioned above.

Concretely, as shown in Das et al. "High Mobility 4H-SiC Inversion Mode MOSFETs Using Thermally Grown, NO Annealed $SiO_2$", IEEE Device Research Conference, Denver in Colorado, Jun. 19 to 21, 2000 and Chung et al., "Effect of nitric oxide annealing on the interface trap densities near the band edges in the 4H polytype of silicon carbide" Applied Physics Letters, Vol. 76, No. 13, pp. 1713-1715, March, 2000, nitrogen is taken into the gate oxide film 107 by anneal processing using NO (i.e., nitrogen oxide gas). As shown in Xu et al., "Improved Performance and Reliability of N20-Grown Oxy-nitride on 6H-SiC" IEEE Electron Device Letters, Vol. 21, No. 6, pp. 298-300, June, 2000, nitrogen is taken into the gate oxide film 107 by performing gate oxidation for taking $N_2O$ (i.e., nitrous oxide gas) into an atmosphere and anneal processing using $N_2$ (i.e., nitrogen gas).

However, in the anneal processing using the NO gas, it is not preferable when an influence on a human body influenced by the NO gas is considered. Further, when the gate oxidation using the $N_2O$ gas is performed, heat treatment of a high temperature of about 1300° C. must be taken for a long time of 360 minutes to take the nitrogen atom into the gate oxide film 107. Therefore, a problem exists in that no power MOSFET can be efficiently manufactured.

SUMMARY OF THE INVENTION

In view of the above-described problem, it is an object of the present invention to provide a SiC semiconductor device and a method for manufacturing the same.

A method for manufacturing a silicon carbide semiconductor device includes the steps of: preparing a semiconductor substrate including a silicon carbide substrate and first to third semiconductor layers, wherein the first semiconductor layer made of silicon carbide and having the first conductive type and an impurity concentration lower than that of the silicon carbide substrate, the second semiconductor layer made of silicon carbide and having the second conductive type, and the third semiconductor layer made of silicon carbide and having the first conductive type are formed on the silicon carbide substrate having a first conductive type or a second conductive type in this order; forming a trench in a cell region of the semiconductor substrate so that the trench penetrates the second and the third semiconductor layers and reaches the first semiconductor layer; forming a fourth semiconductor layer having the first conductive type in the trench by an epitaxial growth method; forming an oxide film in the trench in such a manner that a part of the fourth semiconductor layer disposed on a sidewall of the trench is thermally oxidized, wherein the oxide film includes a part for functioning as a gate oxide film; forming a gate electrode on a surface of the oxide film in the trench; forming a first electrode electrically connecting to the third semiconductor layer; and forming a second electrode electrically connecting to the silicon carbide substrate.

In the method, the oxide film composing the gate oxide film is formed in such a manner that the fourth semiconductor layer is thermally oxidized. Thus, the first conductive type impurity is doped in the gate oxide film. Thus, the above method includes no step of annealing for a long time under high temperature with using a NO gas or a $N_2O$ gas. Therefore, without using the NO gas, the impurity is doped. Thus, the manufacturing method is simplified.

Alternatively, the sidewall of the trench may have a surface orientation of (1-100) or (11-20), and a part of the fourth semiconductor layer disposed on a bottom of the trench has a thickness larger than that of a part of the fourth semiconductor layer disposed on the sidewall of the trench. Alternatively, in the step of forming the oxide film, a part of the fourth semiconductor layer disposed on a lower side of a bottom of the trench may remain without thermal oxidation so that the part of the fourth semiconductor layer provides a low resistance layer.

Further, a method for manufacturing a silicon carbide semiconductor device includes the steps of: preparing a semiconductor substrate including a silicon carbide substrate and first to third semiconductor layers, wherein the first semiconductor layer made of silicon carbide and having the first conductive type and an impurity concentration lower than that of the silicon carbide substrate, the second semiconductor layer made of silicon carbide and having the second conductive type, and the third semiconductor layer made of silicon carbide and having the first conductive type are formed on the silicon carbide substrate having a first conductive type or a second conductive type in this order; forming a trench in a cell region of the semiconductor substrate so that the trench penetrates the second and the third semiconductor layers and reaches the first semiconductor layer; forming a fourth semiconductor layer having the first conductive type in the trench by an epitaxial growth method, wherein a part of the fourth semiconductor layer disposed on a sidewall of the trench has a thickness substantially equal to a thickness of a part of the fourth semiconductor layer disposed on a bottom of the trench; forming a low resistance layer in such a manner that a first conductive type impurity is introduced from an upper side of the semiconductor substrate by an ion implantation method so that the first conductive type impurity is doped through the fourth semiconductor layer on the bottom of the trench; forming an oxide film in the trench in such a manner that a part of the fourth semiconductor layer disposed on the sidewall of the trench is thermally oxidized, wherein the oxide film includes a part for functioning as a gate oxide film; forming a gate electrode on a surface of the oxide film in the trench; forming a first electrode electrically connecting to the third semiconductor layer; and forming a second electrode electrically connecting to the silicon carbide substrate.

In the method, the low resistance layer is formed in such a manner that the first conductive type impurity is doped under the fourth semiconductor layer by implanting the impurity from the upper side of the substrate. Thus, the manufacturing method is simplified.

Alternatively, in the step of forming the oxide film, the low resistance layer disposed under the fourth semiconductor layer on the bottom of the trench remains without thermal oxidation.

Further, a method for manufacturing a silicon carbide semiconductor device includes the steps of: preparing a semiconductor substrate including a silicon carbide substrate and first to third semiconductor layers, wherein the first semiconductor layer made of silicon carbide and having the first conductive type and an impurity concentration lower than that of the silicon carbide substrate, the second semiconductor layer made of silicon carbide and having the second conductive type, and the third semiconductor layer made of silicon carbide and having the first conductive type are formed on the silicon carbide substrate having a first conductive type or a second conductive type in this order; forming a trench in a cell region of the semiconductor substrate so that the trench penetrates the second and the third semiconductor layers and reaches the first semiconductor layer; forming an ion implantation region on an inner wall including a sidewall of the trench in such a manner that a first conductive type impurity, a second conductive type impurity, a silicon atom or a carbon atom is implanted slantwise on the semiconductor substrate; forming an oxide film in the trench in such a manner that a part of the ion implantation region disposed on the sidewall of the trench is thermally oxidized, wherein the oxide film includes a part for functioning as a gate oxide film; forming a gate electrode on a surface of the oxide film in the trench; forming a first electrode electrically connecting to the third semiconductor layer; and forming a second electrode electrically connecting to the silicon carbide substrate.

In the above method, the first conductive type impurity, the second conductive type impurity, the silicon atom or the carbon atom is implanted slantwise so that the ion implantation region is formed on the inner wall of the trench. Then, a part of the ion implantation region is thermally oxidized so that the oxide film is formed.

Further, a silicon carbide semiconductor device includes: a semiconductor substrate including a silicon carbide substrate and first to third semiconductor layers, wherein the first semiconductor layer made of silicon carbide and having the first conductive type and an impurity concentration lower than that of the silicon carbide substrate, the second semiconductor layer made of silicon carbide and having the second conductive type, and the third semiconductor layer made of silicon carbide and having the first conductive type are disposed on the silicon carbide substrate having a first conductive type or a second conductive type in this order; a trench disposed in a cell region of the semiconductor substrate, penetrating the second and the third semiconductor layers, and reaching the first semiconductor layer; an oxide film disposed on an inner wall of the trench and including a part for functioning as a gate oxide film; a low resistance layer on a bottom of the trench having the first conductive type and disposed on a lower side of the oxide film; a gate electrode disposed on a surface of the oxide film in the trench; a first electrode electrically connecting to the third semiconductor layer; and a second electrode electrically connecting to the silicon carbide substrate.

In the device, the oxide film has low interface state density and low fixed charge density, so that the reliability and high performance of the device is improved. Further, since the device includes the low resistance layer, the on-state resistance of the device is reduced.

Alternatively, the device may further include: a channel layer having the first conductive type and disposed on the inner wall of the trench. The oxide film is disposed on a surface of the channel layer, and the low resistance layer has an impurity concentration of a first conductive type impurity higher than that of the channel layer.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment Mode

Figure 1:
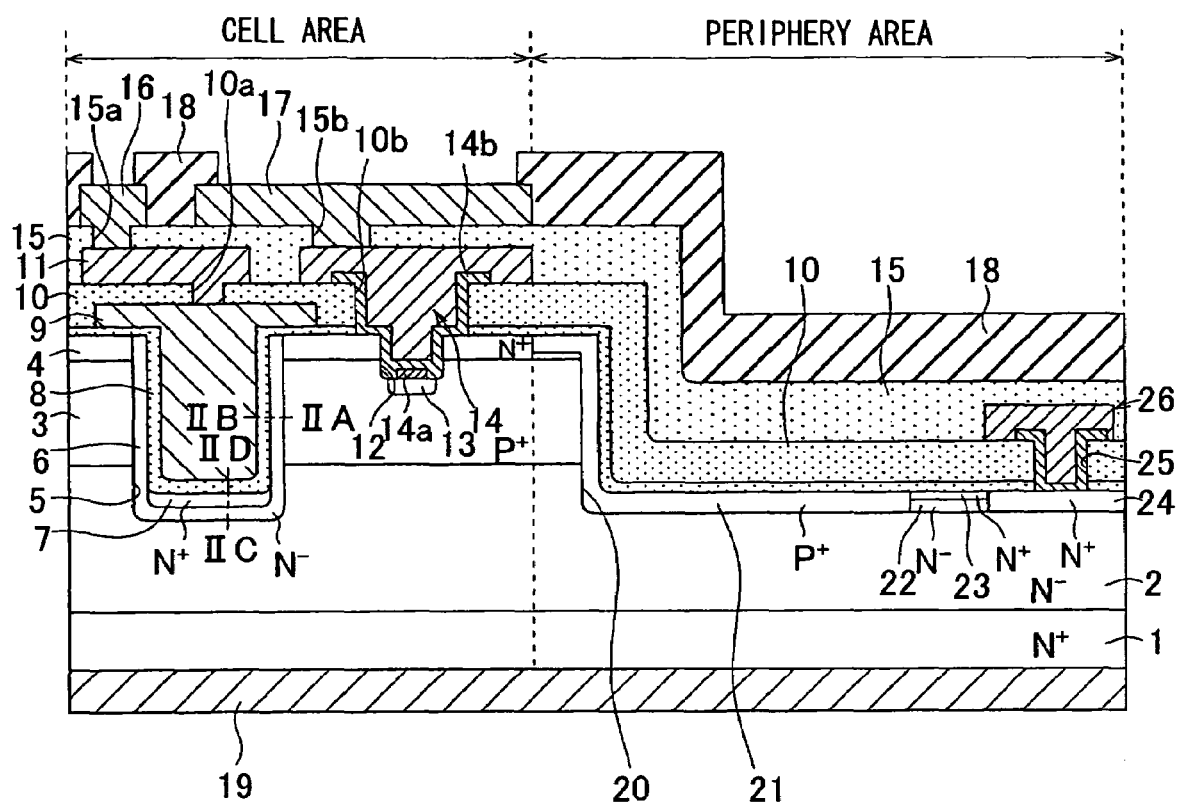
FIG. 1 is a cross sectional view showing an accumulation type vertical power MOSFET according to a first embodiment of the present invention.

FIG. 1 shows the sectional construction of a vertical type power MOSFET of a trench type in a first embodiment mode of the present invention. The structure of the vertical type power MOSFET of this embodiment mode will next be explained with reference to this figure. In this figure, the left-hand side of the paper face shows the sectional construction of a cell area of the vertical type power MOSFET, and the right-hand side shows the sectional construction of an outer circumferential area as a periphery area.

As shown in FIG. 1, an N⁻ type drift layer 2 is arranged on an N⁺ type substrate 1. A P⁺ type base area 3 and an N⁺ type source area 4 are formed on the surface of this N⁻ type drift layer 2. In this embodiment mode, the N⁺ type substrate 1, the N⁻ type drift layer 2, the P⁺ type base area 3 and the N⁺ type source area 4 provide a semiconductor substrate, and the cell area and the outer circumferential area are formed.

A trench 5 extending through the N⁺ type source area 4 and the P⁺ type base area 3 and reaching the N⁻ type drift layer 2 is formed in the cell area. An N⁻ type channel layer 6 is formed in the inner wall of this trench 5. An N⁺ type low resistance layer 7 is formed in a surface layer portion of this N⁻ type channel layer 6 in a portion located on the bottom face of the trench 5.

An oxide film 8 is formed so as to cover one portion of the N⁻ type channel layer 6, the N⁺ type low resistance layer 7 and the N⁺ type source area 4. A portion of this oxide film 8 located within the trench 5, concretely, a portion formed on a side wall face in the trench 5 functions as a gate oxide film. A gate electrode 9 constructed by polysilicon or a metal is formed on the surface of the portion of this oxide film 8 functioning as the gate oxide film. The interior of the trench 5 is buried by this gate electrode 9.

An interlayer insulating film 10 is formed on the surface of the gate electrode 9. A contact hole 10a is formed in this interlayer insulating film 10. A first gate wiring 11 electrically connected to the gate electrode 9 through this contact hole 10a is formed.

In a place different from a forming place of the trench 5 in the substrate, a trench 12 for contact is formed so as to extend through the N⁺ type source area 4 and reach until the P⁺ type base area 3. A P⁺ type contact area 13 is formed on the bottom face of this trench 12 for contact. A first electrode 14 constituting a source electrode is formed through a contact hole 10b formed in the interlayer insulating film 10 so as to be electrically connected to this P⁺ type contact area 13 and the N⁺ type source area 4. In the first electrode 14, different materials are used in a portion coming in contact with the N⁺ type source area 4 and a portion coming in contact with the P⁺ type contact area 13 so as to come in ohmic contact with each of an N type semiconductor and a P type semiconductor. For example, the portion of the first electrode 14 coming in contact with the N⁺ type source area 4 is constructed by Ni, and the portion of the first electrode 14 coming in contact with the P⁺ type contact area 13 is constructed by Al and Ti.

Further, an interlayer insulating film 15 is formed so as to include the interlayer insulating film 10 and to cover the surfaces of the first gate wiring 11 and the first electrode 14. Contact holes 15a, 15b are formed in this interlayer insulating film 15. A second gate wiring 16 and a second source wiring 17 formed on the surface of the interlayer insulating film 15 through each of these contact holes 15a, 15b are respectively electrically connected to the first gate wiring 11 and the first electrode 14. A protecting film 18 is formed so as to cover a portion except for a portion for connection of a gate pad 16 and a source pad 17. A second electrode 19 functioning as a drain electrode is formed on the rear face side of the N⁺ type substrate 1 so that the cell area is constructed.

On the other hand, a concave portion 20 having a depth similar to that of the trench 5 is formed in the outer circumferential area. A P⁺ type layer 21 for constituting a JTE structure is formed in a surface layer portion of a portion near the cell area on the side wall face and the bottom face of this concave portion. An N⁻ type layer 22 and an N⁺ type layer 23 are formed on the outer circumferential side from this P⁺ type layer 21. An N⁺ type layer 24 for constituting an EQR structure is formed on the outer circumferential side of the N⁻ type layer 22 and the N⁺ type layer 23.

The oxide film 8 and the interlayer insulating film 10 are formed on the surfaces of the P⁺ type layer 21, the N⁻ type layer 22, the N⁺ type layer 23 and the N⁺ type layer 24 so as to be connected from the cell area. An electrode 26 for EQR is formed through a contact hole 25 extending through the interlayer insulating film 10 and the oxide film 8. This electrode 26 for EQR is electrically connected to the N⁺ type layer 24. A portion of the electrode 26 for EQR coming in contact with the N⁺ type layer 24 is constructed by Ni, etc. so as to come in ohmic contact with an N type semiconductor.

The interlayer insulating film 15 and the protecting film 18 are formed so as to be connected from the cell area, and the entire outer circumferential area including the electrode 26 for EQR is covered with these films.

The vertical type power MOSFET for the trench type of this embodiment mode is constructed by such a structure. In such a construction, the film thicknesses of the N⁻ type channel layer 6, the N⁺ type low resistance layer 7 and the oxide film 8 and the dopant concentration of N type impurities are set as follows.

Figure 2A:
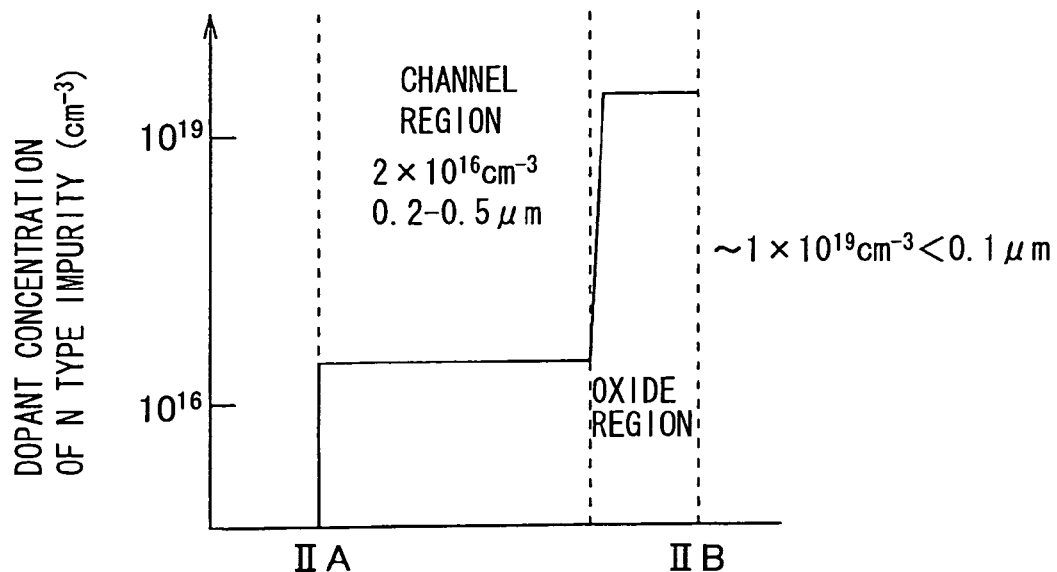
FIG. 2A is a graph showing a profile between dopant concentration of a N type impurity and thickness of a $N^-$ type channel layer and an oxide film taken along line IIA-IIB in FIG. 1.
Figure 2B:
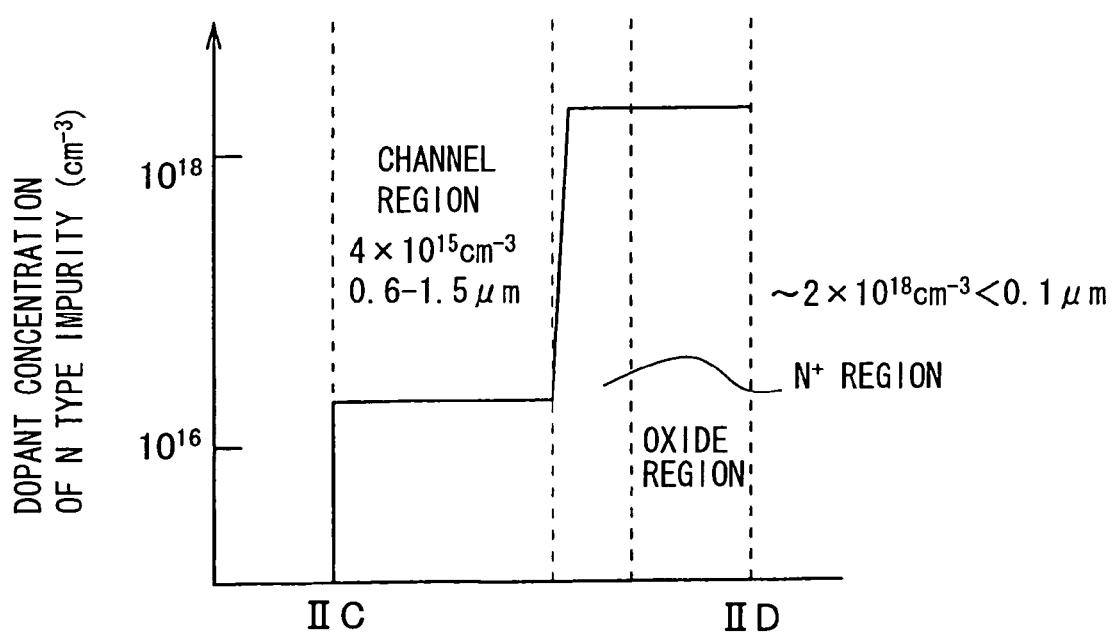
FIG. 2B is a graph showing a profile between dopant concentration of the N type impurity and thickness of the $N^-$ type channel layer, a $N^+$ type low resistance layer and the oxide film taken along line IIC-IID in FIG. 1.

FIGS. 2A and 2B show profiles of the film thicknesses of the N⁻ type channel layer 6, the N⁺ type low resistance layer 7 and the oxide film 8 and the dopant concentration of N type impurities on lines IIA-IIB and IIC-IID within FIG. 1.

On line IIA-IIB within FIG. 1, the N⁻ type channel layer 6 is set to 0.2 to 0.5 μm in film thickness, and is also set to about $1 \times 10^{16}$ to $1 \times 10^{17}$ cm$^{-3}$ in impurity concentration. In this embodiment mode, as shown in FIG. 2A, the impurity concentration is set to $2 \times 10^{16}$ cm$^{-3}$. The oxide film 8 is set to 0.1 μm or less in film thickness and is also set to $1 \times 10^{17}$ cm$^{-3}$ or more in impurity concentration. In this embodiment mode, as shown in FIG. 2A, this impurity concentration is set to $1 \times 10^{19}$ cm$^{-3}$.

On line IIC-IID, the N⁻ type channel layer 6 is set to 0.6 to 1.5 μm in film thickness, and is also set to about $2 \times 10^{15}$ to $2 \times 10^{16}$ cm$^{-3}$ in impurity concentration. In this embodiment mode, as shown in FIG. 2B, this impurity concentration is set to $4 \times 10^{15}$ cm$^{-3}$. The N⁺ type low resistance layer 7 is set to 0.2 μm or less in film thickness, and is also set to $2 \times 10^{16}$ cm$^{-3}$ or more in impurity concentration. In this embodiment mode, as shown in FIG. 2B, this impurity concentration is set to $2 \times 10^{18}$ cm$^{-3}$. Further, the oxide film 8 is set to 0.1 μm or less in film thickness and is also set to $2 \times 10^{16}$ cm$^{-3}$ or more in impurity concentration. In this embodiment mode, as shown in FIG. 2B, this impurity concentration is set to $2 \times 10^{18}$ cm$^{-3}$.

The manufacturing method of the vertical type power MOSFET constructed as above will be explained with reference to the manufacturing process views of the vertical type power MOSFET shown in FIGS. 3 to 21.

Figure 3:
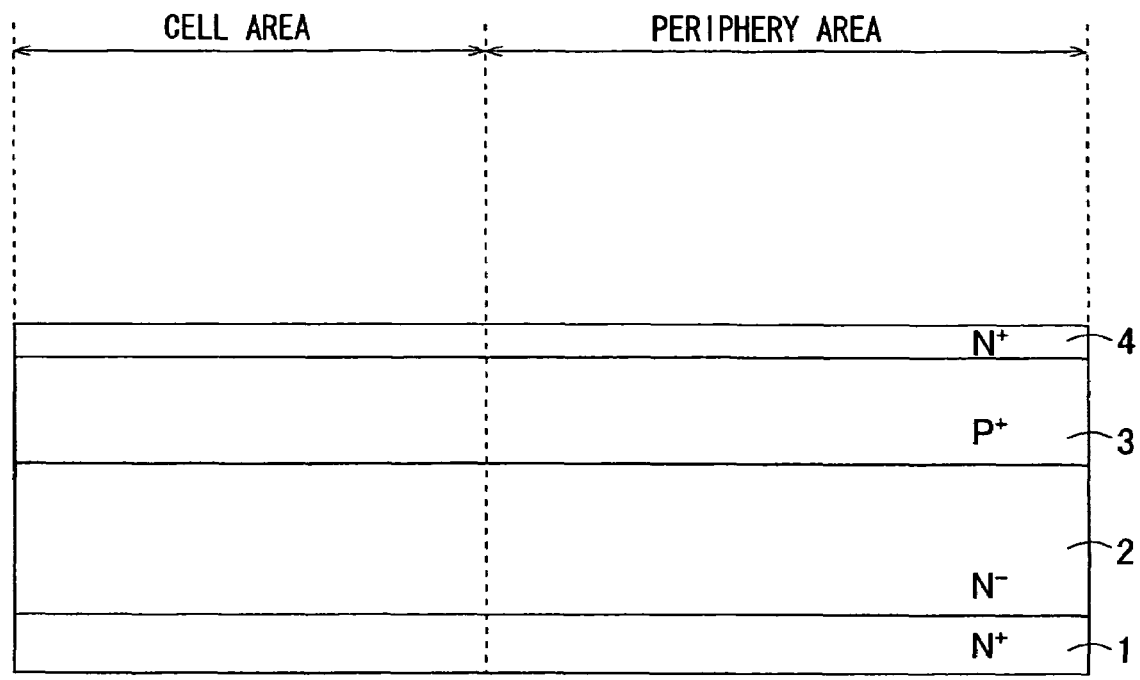
FIGS. 3-21 are cross sectional views explaining a method for manufacturing the MOSFET according to the first embodiment.

[Process Shown in FIG. 3]

First, a substrate having an N⁻ type drift layer 2, a P⁺ type base area 3 and an N⁺ type source area 4 epitaxially grown on the surface of an N⁺ type substrate 1 having a main surface set to an off plane of [1-100] is prepared. For example, the dopant concentration of the N⁺ type substrate 1 is set to $1 \times 10^{19}$ cm$^{-3}$, and the dopant concentration of the N⁻ type drift layer 2 is set to $5 \times 10^{15}$ cm$^{-3}$. The dopant concentration of the P⁺ type base area 3 is set to $1 \times 10^{18}$ cm$^{-3}$, and the dopant concentration of the N⁺ type source area 4 is set to $1 \times 10^{20}$ cm$^{-3}$. The surface of such a substrate is set to the off plane of [1-100] since each layer takes over a surface state of the N⁺ type substrate 1.

Figure 4:
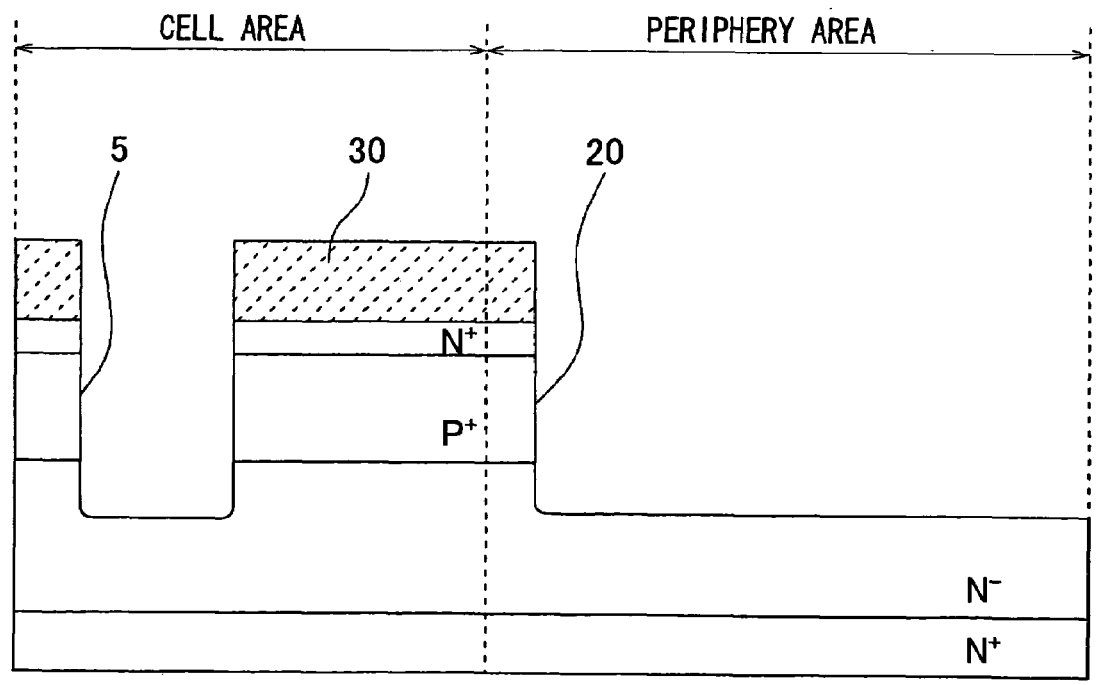

[Process Shown in FIG. 4]

A mask 30 opened in a predetermined position for forming a trench 5 and a concave portion 20 on the surface of the substrate is made, and etching of 4 to 5 μm is performed from above this mask 30. Thus, the trench 5 is formed in a cell area, and the concave portion 20 is formed in an outer circumferential area. At this time, for example, a layout for conforming the side wall face of the trench 5 to a plane of (1-100) or (11-20) is adopted.

Figure 5:
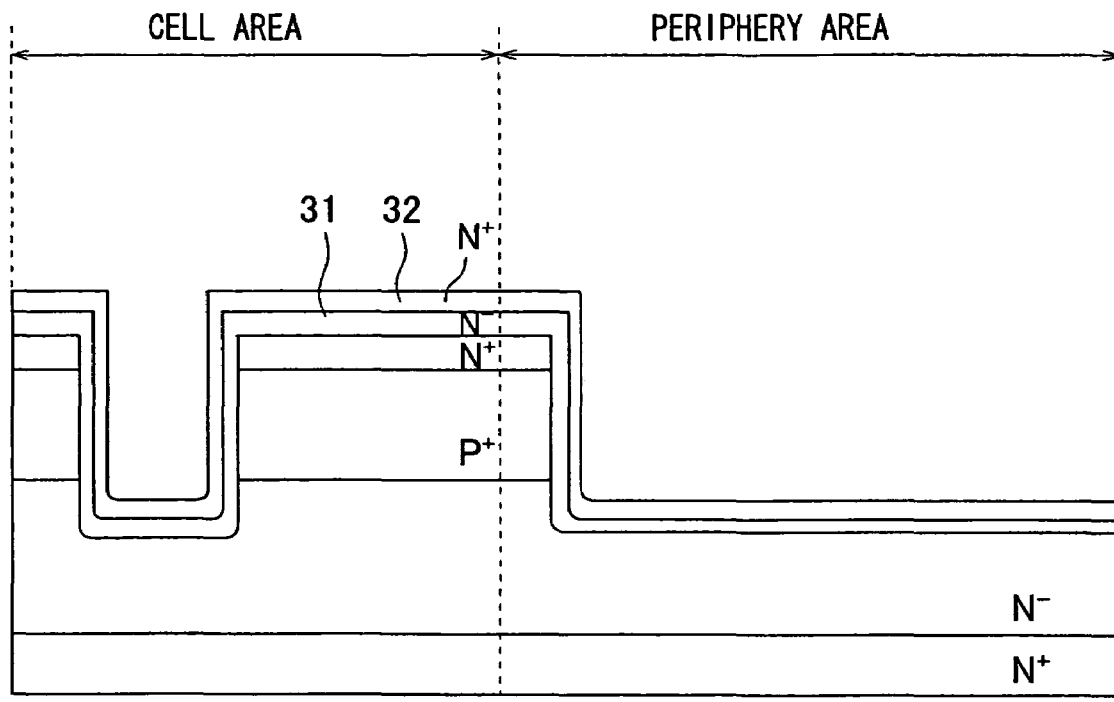

[Process Shown in FIG. 5]

After the mask 30 is removed, an N⁻ type layer 31 is formed by the CVD method and an N⁺ type layer 32 is continuously formed as it is. For example, the N⁻ type layer 31 and the N⁺ type layer 32 are formed under a condition of 1600° C., 1.0 μm/h in growth rate, and 1.0 or less in C/Si raw material gas introducing ratio. At this time, for example, nitrogen (N₂) is introduced into an atmosphere so as to introduce N into the N⁻ type layer 31 and the N⁺ type layer 32 as N type impurities.

Thus, for example, the N⁻ type layer 31 having $1 \times 10^{16}$ cm$^{-3}$ in dopant concentration and the N⁺ type layer 32 having $1 \times 10^{20}$ cm$^{-3}$ in dopant concentration are formed on the inner wall faces of the trench 5 and the concave portion 20.

At this time, with respect to the trench 5, the film thicknesses and the dopant concentrations of the N⁻ type layer 31 and the N⁺ type layer 32 are changed in accordance with a structure formed on the bottom face of the trench 5, a structure formed on the side wall face, and a structure formed on the surface of the substrate. Concretely, in the impurity layer, the film thickness of a portion formed on the side wall face of the trench 5 is thinner than the film thickness of a portion formed on the bottom face, and is raised in the dopant concentration. Further, in the impurity layer, a portion formed on the bottom face of the trench 5 becomes thicker than a portion formed on the surface of the substrate.

Such a relation is formed because it is difficult to deposit the impurity layer in the side wall of the trench 5 in comparison with the bottom face, and the bottom face of the trench 5 is buried by the impurity layer unable to be deposited in the side wall of the trench 5 and is increased in the depositing amount in comparison with the surface of the substrate since the width of the trench 5 is narrow.

Figure 22A:
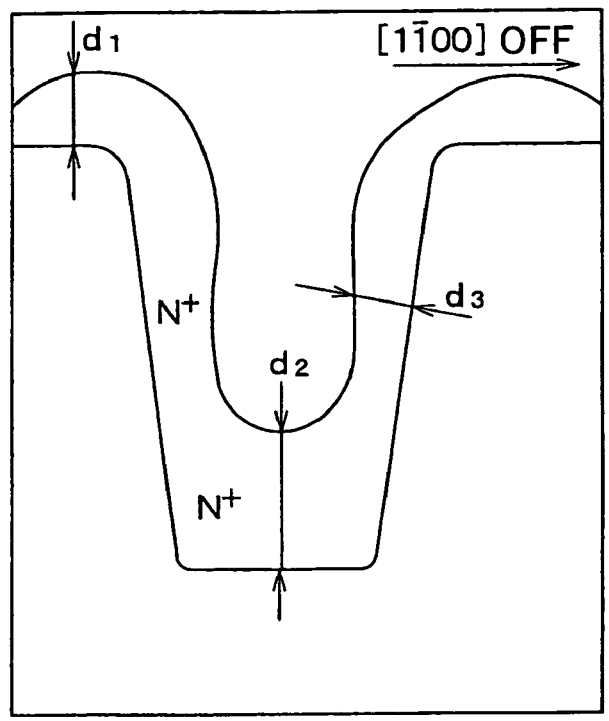
FIGS. 22A and 22B are cross sectional views explaining a relationship between the thickness of a $N^-$ type layer or a $N^+$ type layer and a dopant concentration, according to the first embodiment.

The relation of the film thickness and the dopant concentration at this time depends on the plane orientation of the surface of the substrate, the plane orientation of the side wall face of the trench and a growing condition. However, in the case of this embodiment mode, it has been found that the following relation is formed. FIG. 22A is a view for explaining this relation.

With respect to the film thicknesses of the N⁻ type layer 31 and the N⁺ type layer 32, as shown in FIG. 22A, it has been confirmed that the following relation is formed when the film thickness of the portion formed on the bottom face of the trench 5 is set to d2 and the film thickness of the portion formed on the surface of the substrate is set to d1 and the film thickness of the portion formed on the side wall face of the trench 5 is set to d3.

$$d2 = 2 \times d1 \quad \text{(Formula 1)}$$

$$d2 = 3 \times d3 \quad \text{(Formula 2)}$$

This relation of the film thickness is changed in accordance with the growing condition, etc. For example, the thickness d2 is set to three times larger than the thickness d3 in formula 2, but may become in a range of three to five times larger than the thickness d3. For example, the growth rates of the N⁻ type layer 31 and the N⁺ type layer 32 become 10 nm/hr on the side wall face of the trench 5. In contrast to this, these growth rates become 30 to 50 nm/hr on the bottom face of the trench 5 so that the above range is attained.

With respect to the dopant concentrations of the N⁻ type layer 31 and the N⁺ type layer 32, the concentration of the portion formed on the side wall face of the trench 5 becomes about five times the concentration of the portion formed on the bottom face of the trench 5.

Figure 6:
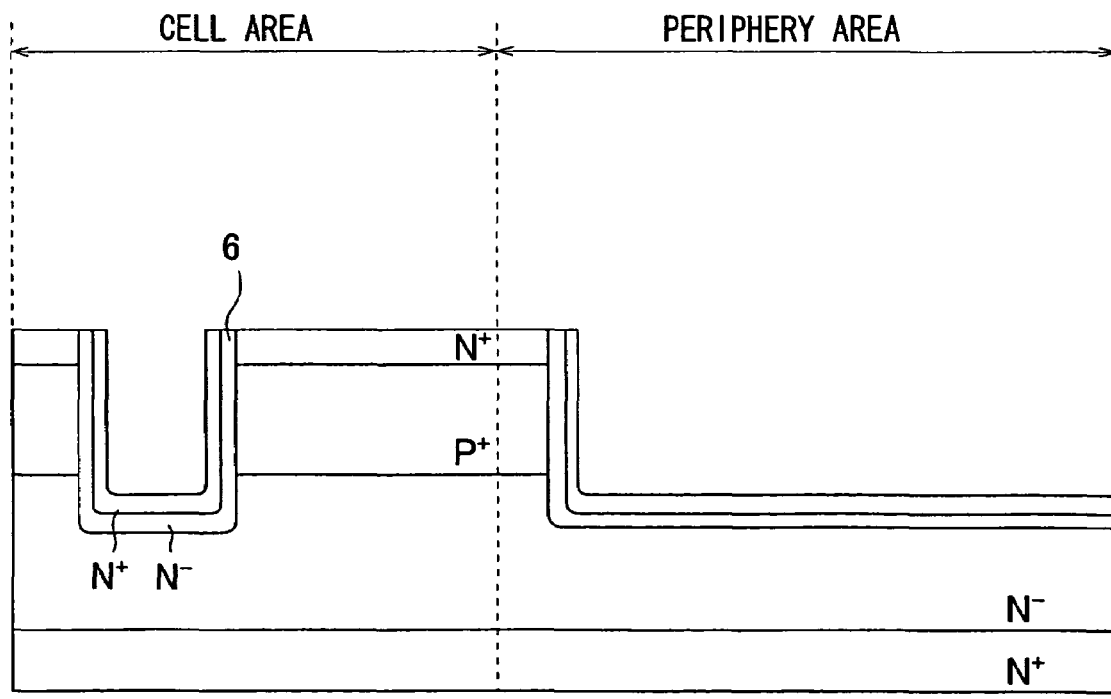

[Process Shown in FIG. 6]

The portion formed on the surface of the substrate within the N⁻ type layer 31 and the N⁺ type layer 32 is removed by etch back processing. Thus, the N⁺ type source area 4 is exposed and the N⁻ type channel layer 6 is formed by the N⁻ type layer 31 left within the trench 5.

Figure 7:
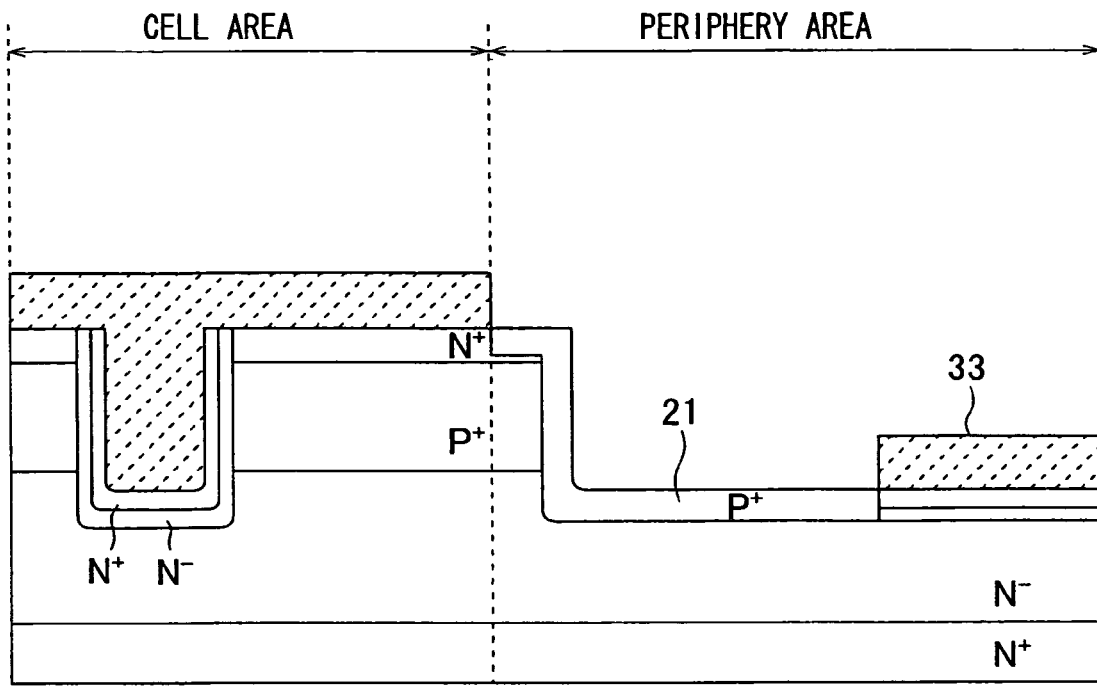

[Process Shown in FIG. 7]

A portion of the cell area and the outer circumferential area except for a predetermined area for forming the P⁺ type layer 21 is covered with a mask 33. Thereafter, a P⁺ type layer 21 is formed by implanting ions of Al or B as P type impurities from above the mask 33.

Figure 8:
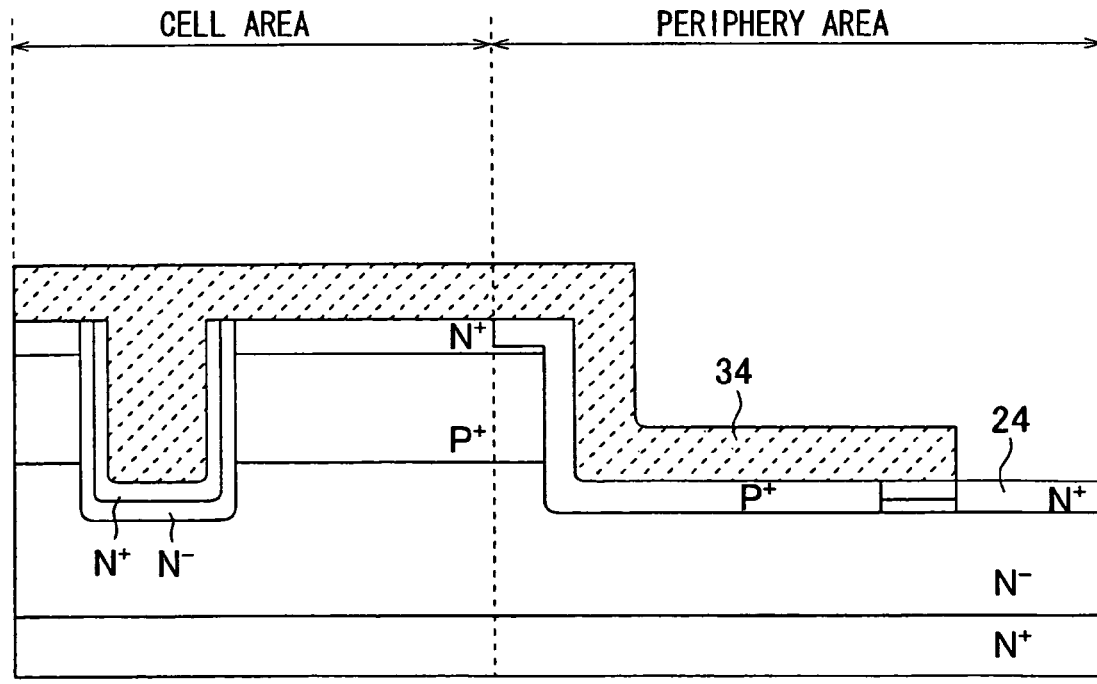

[Process Shown in FIG. 8]

After the mask 33 is removed, a portion except for a predetermined area for forming an N⁺ type layer 24 for constituting EQR is covered with a mask 34. Thereafter, an N⁺ type layer 24 is formed by implanting ions of P or N as N type impurities from above the mask 34.

Figure 9:
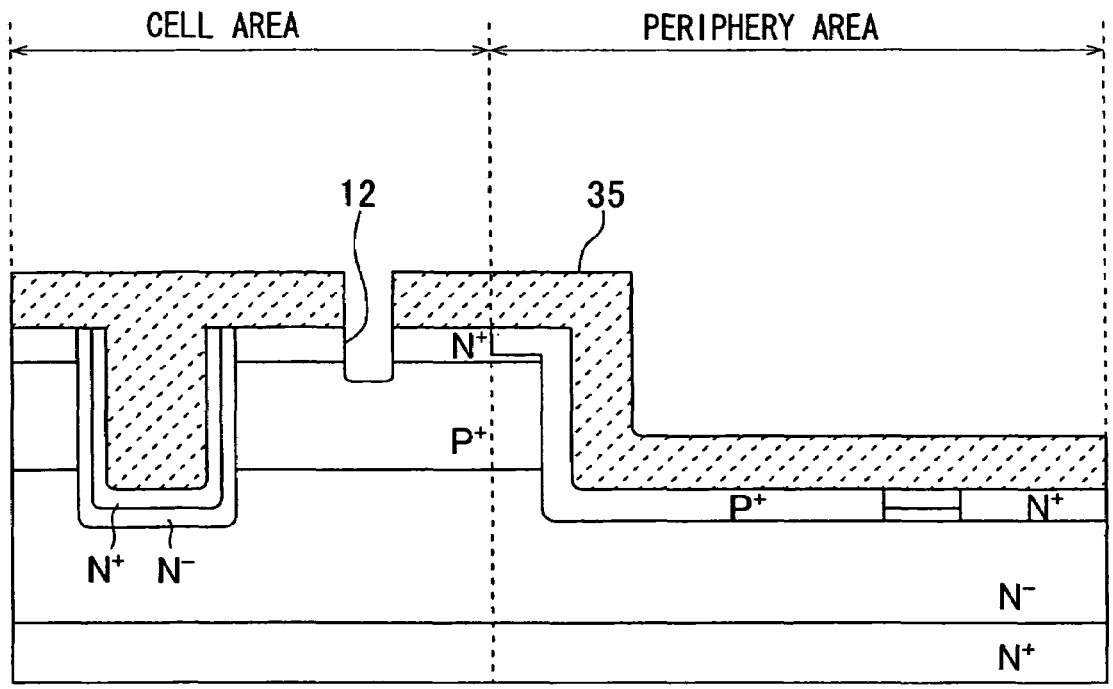

[Process Shown in FIG. 9]

After the mask 34 is removed, a portion except for a predetermined area for forming a trench 12 for contact is covered with a mask 35. Thereafter, the trench 12 for contact extending through the N+ type source area 4 and reaching the P+ type base area 3 is formed by performing etching using the mask 35.

Figure 10:
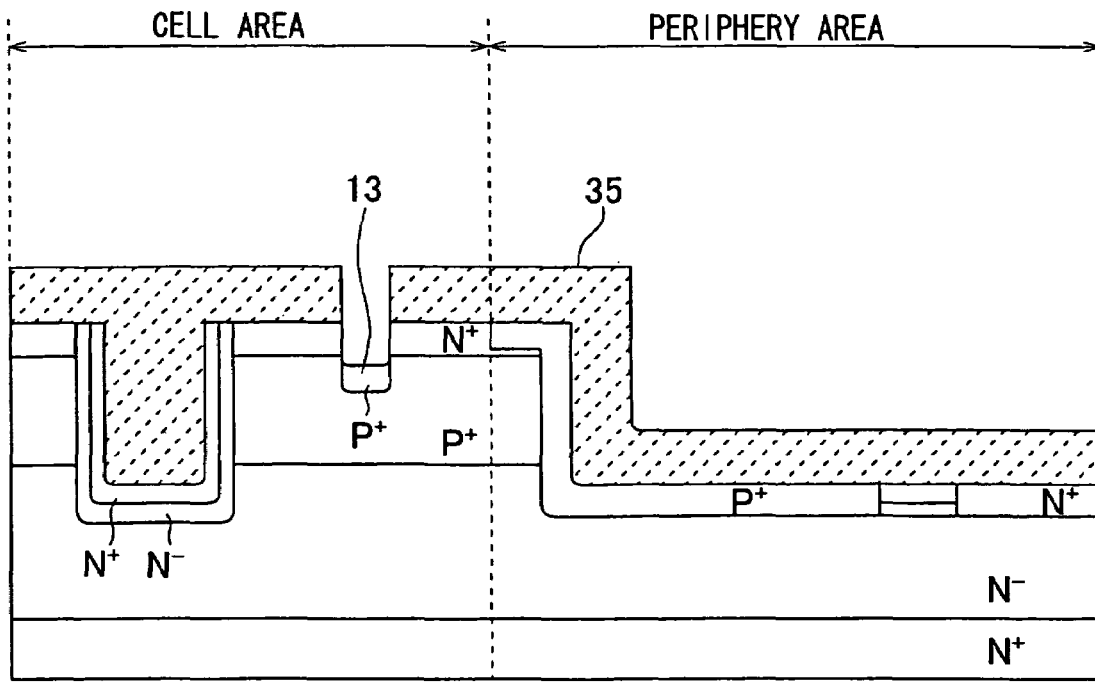

[Process Shown in FIG. 10]

The mask 35 used in forming the trench 12 for contact is used as it is, and ions of Al or B are implanted as P type impurities. Thereafter, a P+ type contact area 13 is formed by activating the implanted ions by anneal processing.

Figure 11:
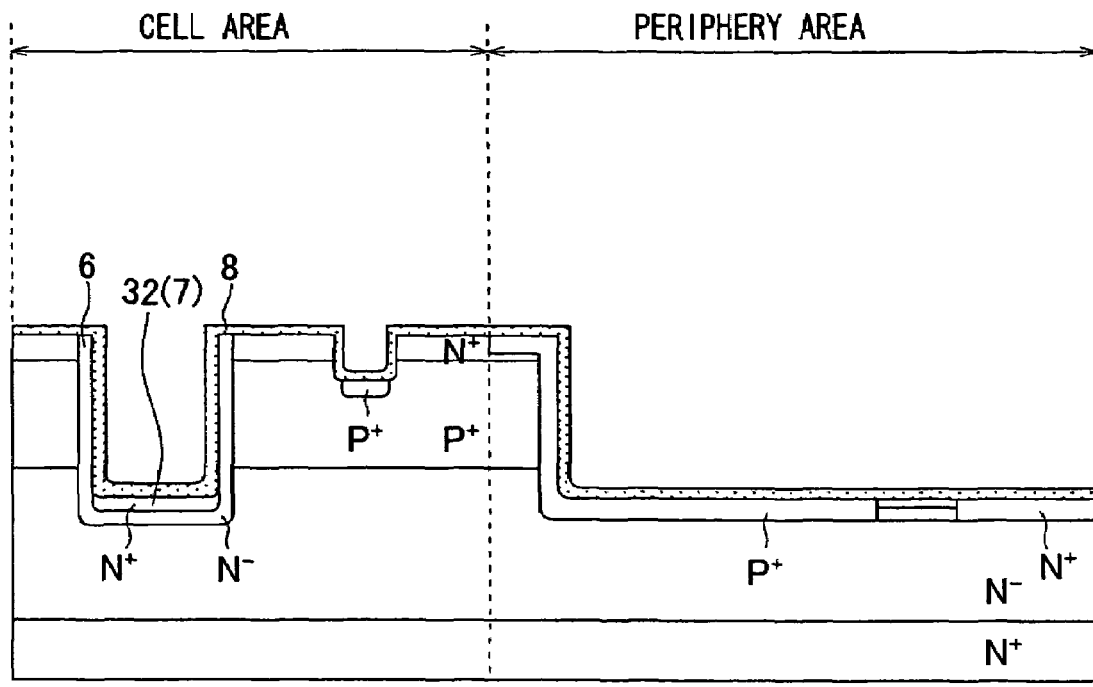

[Process Shown in FIG. 11]

After sacrifice oxidation step and the like are performed in accordance with necessity, an oxide film 8 doping N type impurities thereto is formed by oxidizing the N+ type layer 32 by thermal oxidation. The concentration of the N type impurities doped to this oxide film 8 basically becomes the concentration of the N type impurities included in the oxidized N+ type layer 32.

At this time, process time and process temperature of the thermal oxidation are adjusted so as to oxidize all portions formed on the side wall face of the trench 5 within the N+ type layer 32. Thus, only the N− type channel layer 6 and the oxide film 8 are left and the N+ type layer 32 is removed on the side wall face of the trench 5. The N+ type layer 32 is left on the bottom face of the trench 5 as well as the N− type channel layer 6 and the oxide film 8. An N+ type low resistance layer 7 is formed by this N+ type layer 32.

Figure 12:
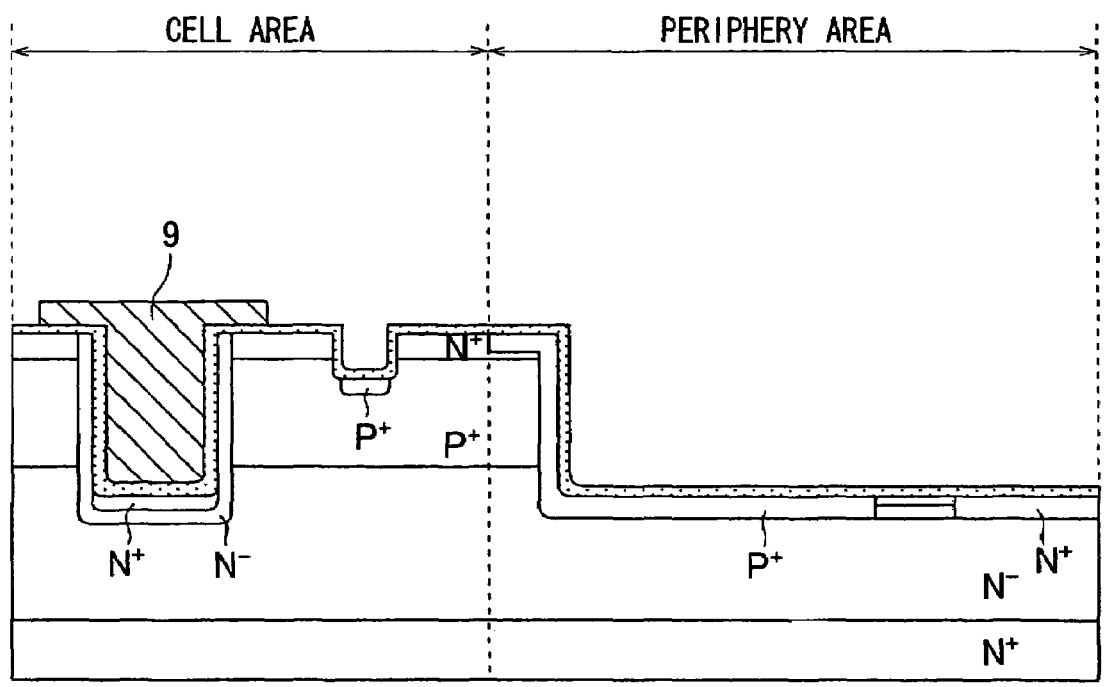

[Process Shown in FIG. 12]

A polysilicon layer doping impurities thereto or a metallic layer is arranged on the surface of the oxide film 8, and is then etched back and a gate electrode 9 is formed by leaving only a portion for burying the interior of the trench 5.

Figure 13:
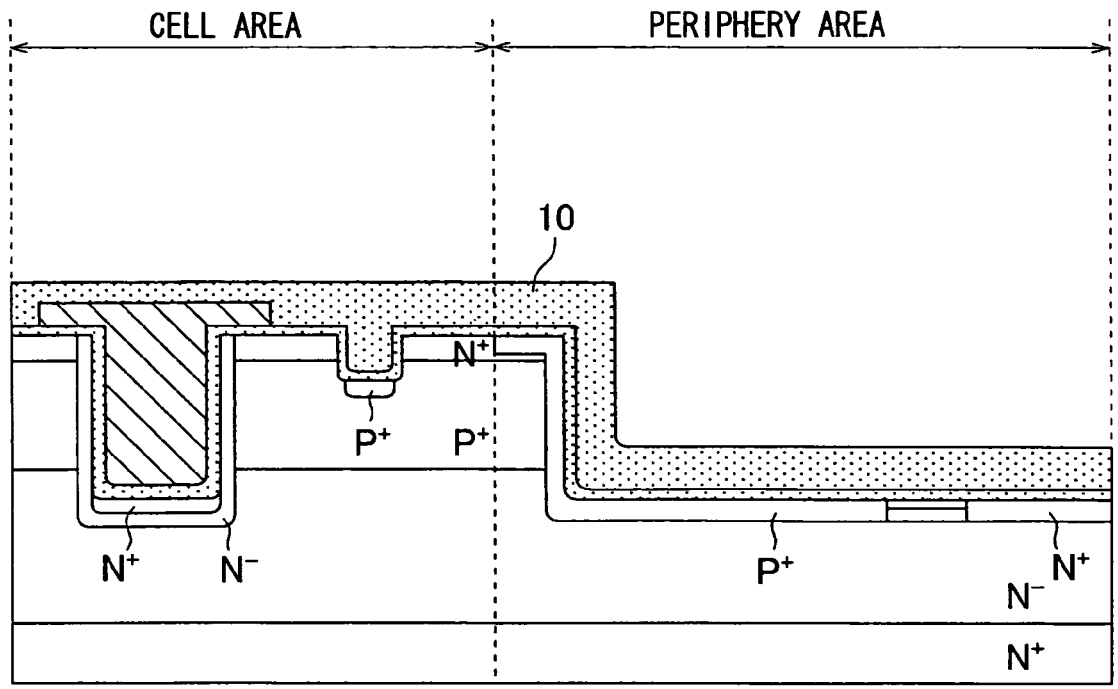

[Process Shown in FIG. 13]

After thermal oxidation processing is performed, an interlayer insulating film 10 is formed by depositing an oxide film by the CVD method.

Figure 14:
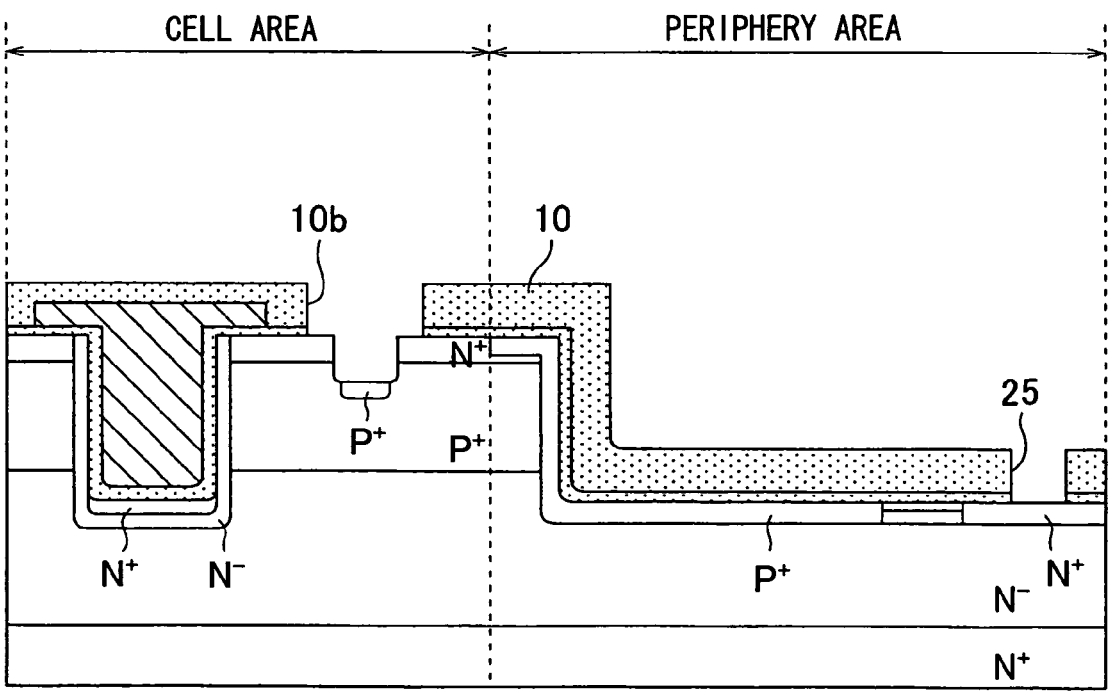

[Process Shown in FIG. 14]

Subsequently, contact holes 10b and 25 are formed by partially removing the interlayer insulating film 10 and the oxide film 8 by performing etching using an unillustrated mask.

Figure 15:
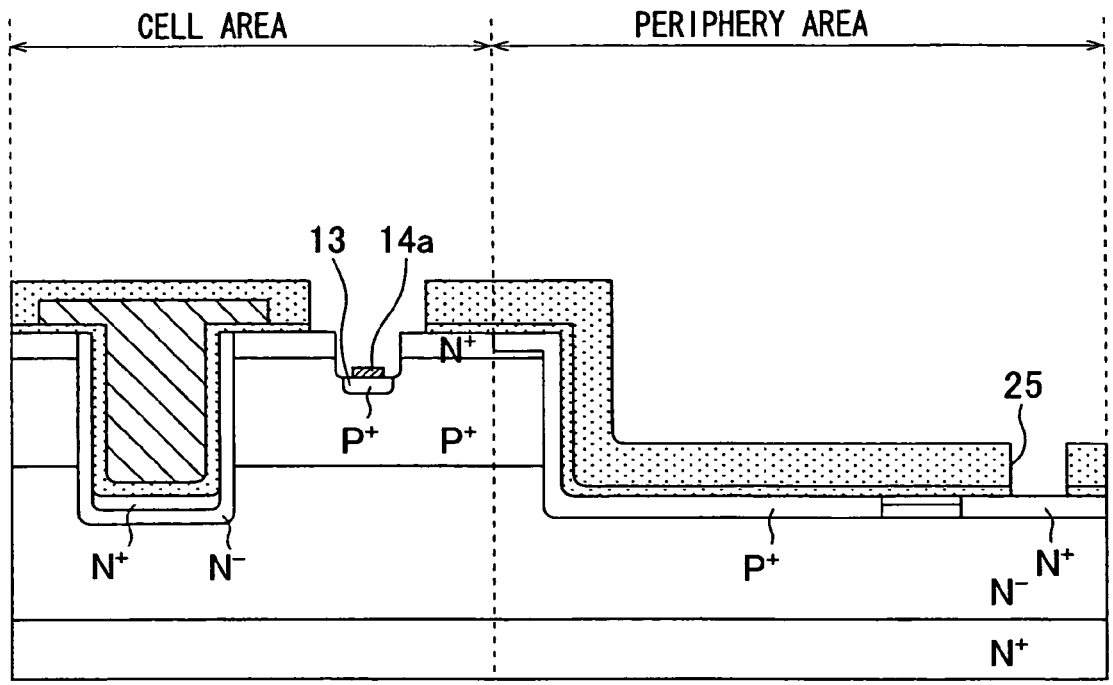

[Process Shown in FIG. 15]

A metallic film such as an Al film, a Ti film, etc. coming in ohmic contact with a P type semiconductor is deposited, and is left on only the P+ type contact area 13 by patterning this metallic film. Thus, one portion 14a of a first electrode 14 is formed.

Figure 16:
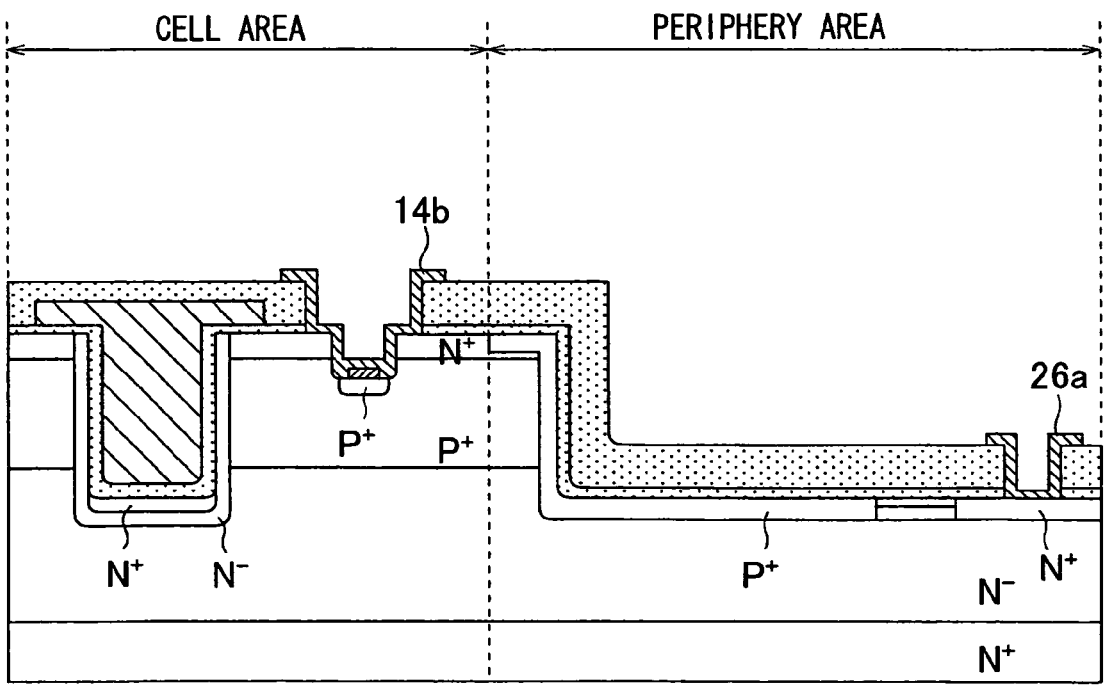

[Process Shown in FIG. 16]

A metallic film such as a Ni film, etc. coming in ohmic contact with an N type semiconductor is deposited and is left on the N+ type source area 4 by patterning this metallic film. Thus, one portion 14b of the first electrode 14 is formed and one portion 26a of an electrode 26 for EQR is formed.

Figure 17:
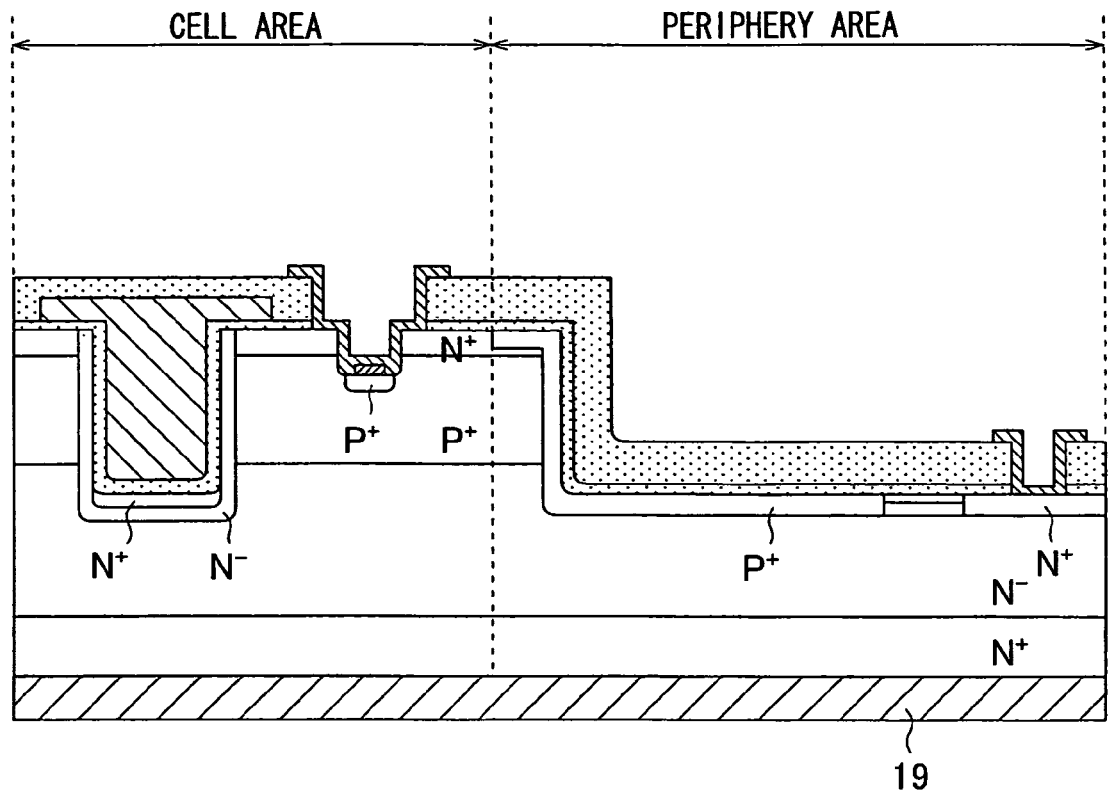

[Process Shown in FIG. 17]

A second electrode 19 constituting a drain electrode is formed by depositing a metallic film of a double structure of Ti/Ni on the rear face side of the N+ type substrate 1.

Figure 18:
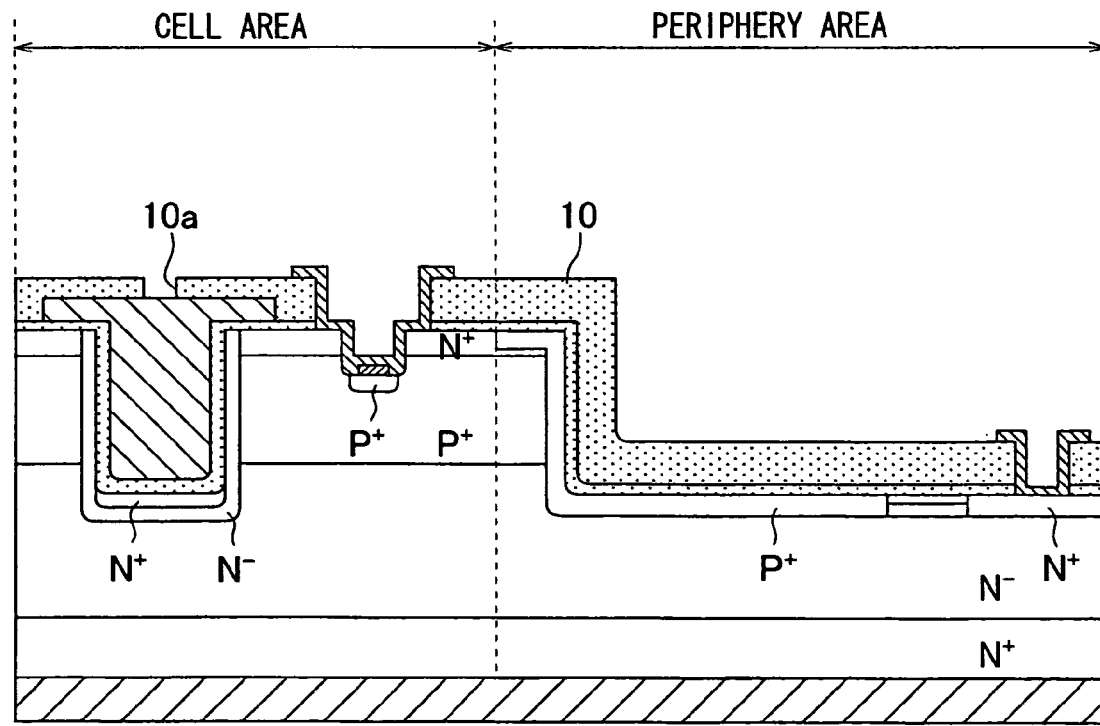

[Process Shown in FIG. 18]

A contact hole 10a is formed with respect to the interlayer insulating film 10 by etching using a mask although this process is not illustrated.

Figure 19:
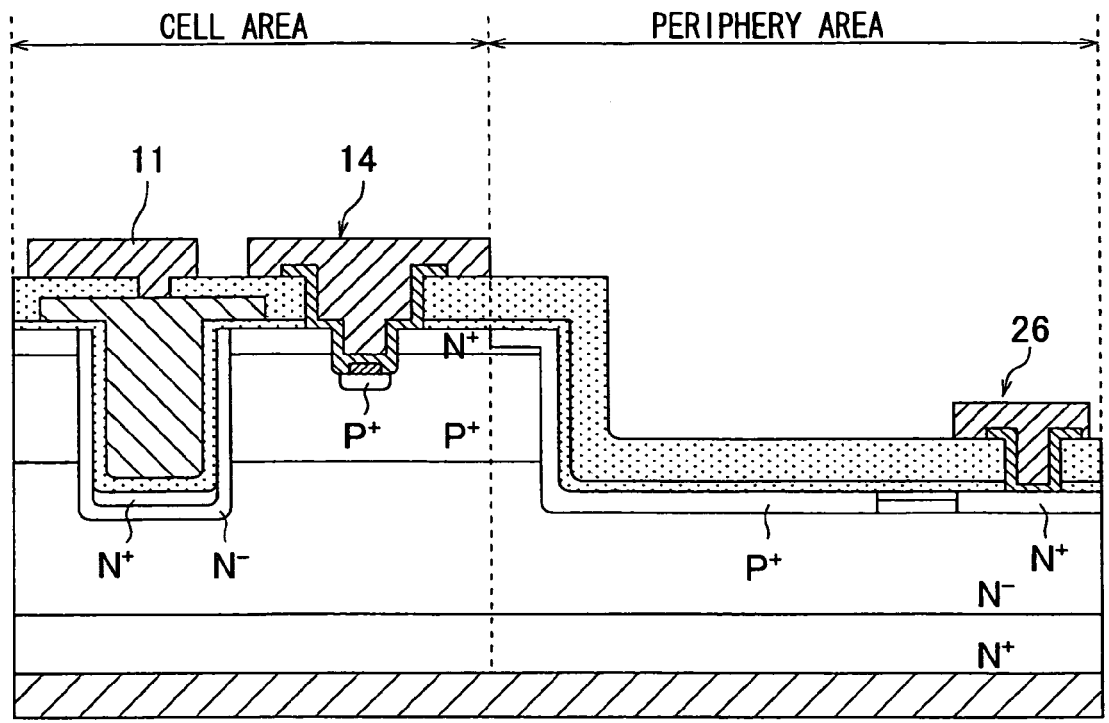

[Process Shown in FIG. 19]

A first wiring layer constructed by Au, etc. is formed so as to cover one portion 14b of the first electrode 14 and the surface of the electrode 26 for EQR including the surface of the interlayer insulating film 10. A first gate wiring 11, the remaining portion of the first electrode 14 and the remaining portion of the electrode 26 for EQR are formed by patterning the first wiring layer.

Figure 20:
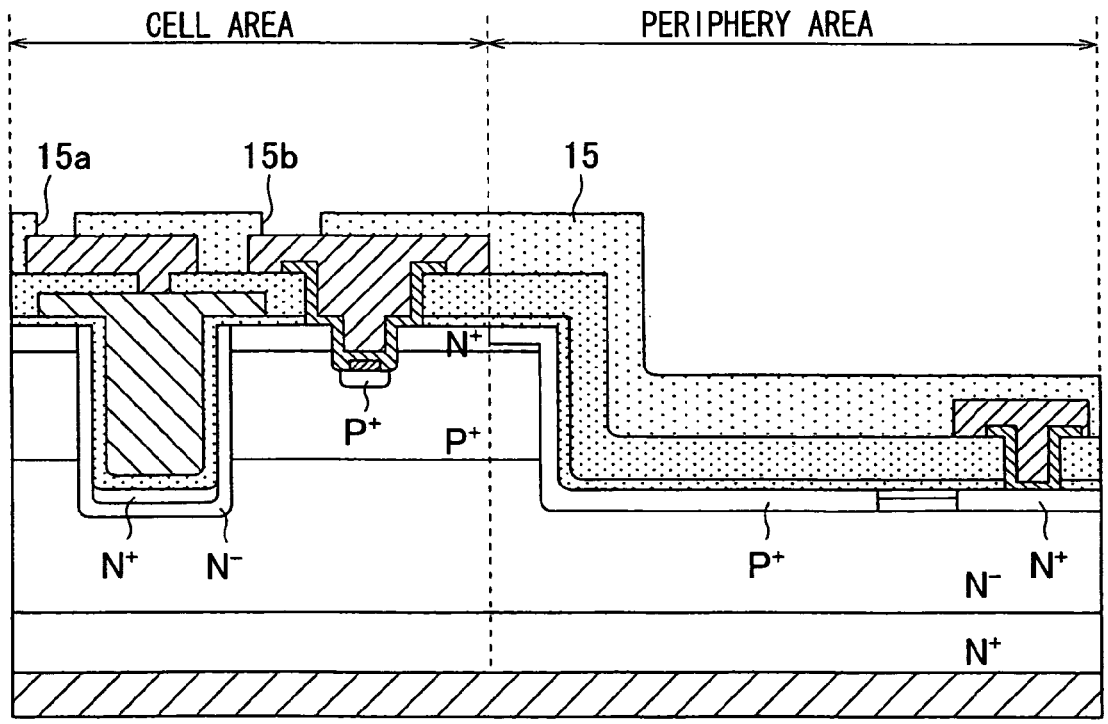

[Process Shown in FIG. 20]

After thermal oxidation processing is performed, an interlayer insulating film 15 is formed by depositing an oxide film by the CVD method. Subsequently, contact holes 15a, 15b are formed by partially removing the interlayer insulating film 15 by performing etching using an unillustrated mask.

Figure 21:
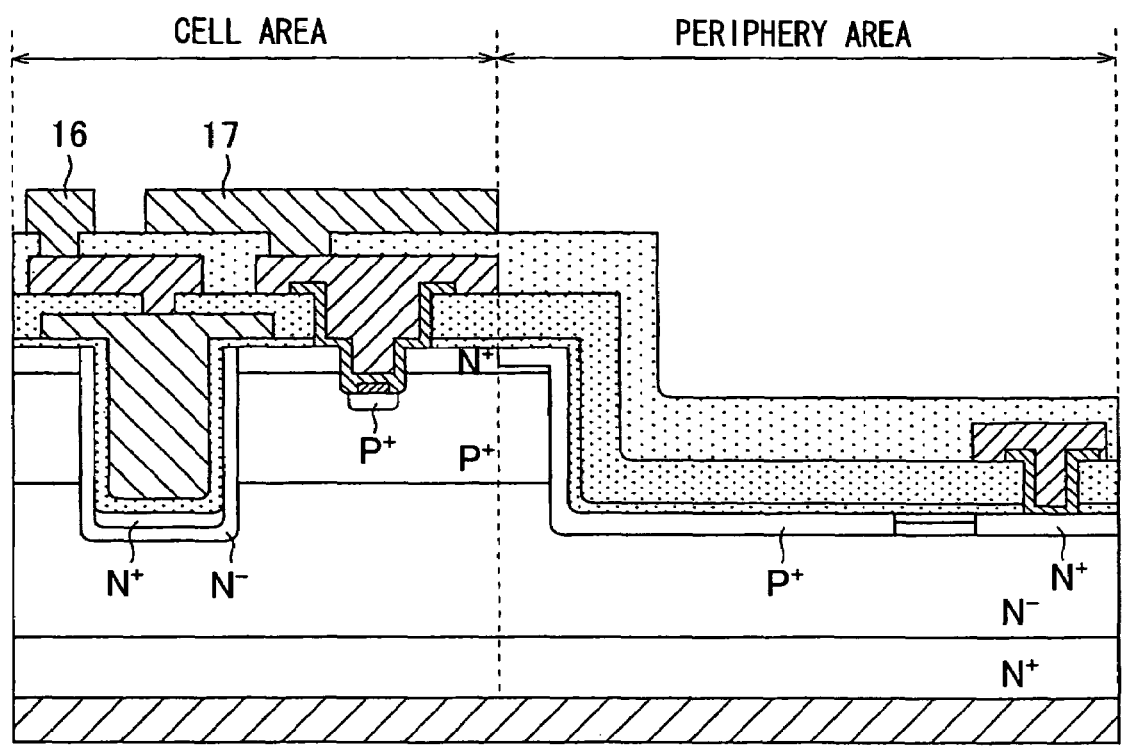

[Process Shown in FIG. 21]

After a second wiring layer is formed on the surface of the interlayer insulating film 15, a second gate wiring 16 and a second source wiring 17 are formed by patterning this second wiring layer. The second gate wiring 16 and the second source wiring 17 are respectively electrically connected to the first gate wiring 11 and the first electrode 14 through the contact holes 15a, 15b.

Thereafter, the vertical type power MOSFET of the trench type shown in FIG. 1 is completed by forming a protecting film 18.

As explained above, in the vertical type power MOSFET of this embodiment mode, the N+ type layer 32 is formed as a film and the oxide film 8 constituting the gate oxide film is formed by thermally oxidizing this N+ type layer 32. Thus, a structure low in interface level density and fixing electric charge density and high in reliability and performance is formed by doping the N type impurities into the gate oxide film.

When the oxide film 8 doping the N type impurities thereto is formed by thermally oxidizing such an N+ type layer 32, the N type impurities can be doped into the oxide film 8 even when the NO gas is used and no heat treatment of long time and high temperature using the $N_2O$ gas is taken as in a case in which the N type impurities are doped after the conventional oxide film is formed. Concretely, it is sufficient to only introduce the $N_2$ gas (i.e., nitrogen gas) generally included within the air into the atmosphere of a raw material in forming the N+ type layer 32. Accordingly, in accordance with the vertical type power MOSFET of the structure shown in this embodiment mode, its manufacturing process can be also simplified.

Second Embodiment Mode

Figure 23:
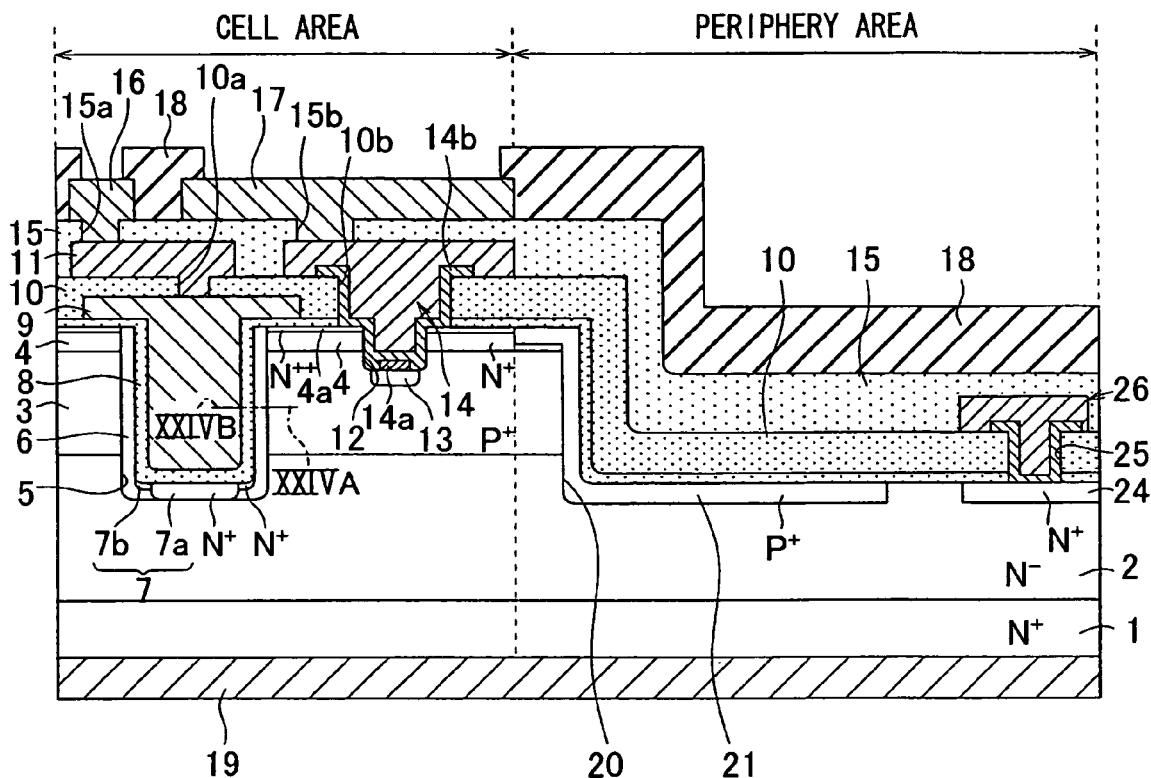
FIG. 23 is a cross sectional view showing an accumulation type vertical power MOSFET according to a second embodiment of the present invention.

A second embodiment mode of the present invention will be explained. FIG. 23 shows the sectional construction of a vertical type power MOSFET of the trench type in this embodiment mode. The construction of the vertical type power MOSFET of this embodiment mode will next be explained with reference to FIG. 23.

In the vertical type power MOSFET of this embodiment mode, the N+ type substrate 1 having a surface set to an off plane of [11-20] is used, and the side wall face of the trench 5 is set to plane of (11-20).

As shown in FIG. 23, in the vertical type power MOSFET of this embodiment mode, the N+ type low resistance layer 7 is formed in a portion located on the bottom face of the trench 5 within the N− type channel layer 6 formed within the trench 5. However, a structure for partially deepening an area 7a of one portion of this N+ type low resistance layer 7 and reaching the most bottom face side of the N− type channel layer 6, i.e., reaching until the N− type drift layer 2 is formed.

The position of a terminal of the area 7a partially deepened within this N+ type low resistance layer 7 is conformed to the surface of a portion located in the side wall of the trench 5 within the oxide film 8.

An area 4a further raised in the impurity concentration of the N type impurities within the N+ type source area 4 is also formed in a surface layer portion of the N+ type source area 4.

This embodiment mode is also constructed such that the N⁻ type layer 22 and the N⁺ type layer 23 formed in the first embodiment mode between the P⁺ type area 21 and the N⁺ type area 24 are removed.

The vertical type power MOSFET of the trench type of this embodiment mode is constructed by such a structure. In such a construction, the film thicknesses of the N⁻ type channel layer 6 and the oxide film 8 and the dopant concentration of the N type impurities are set as follows.

Figure 24:
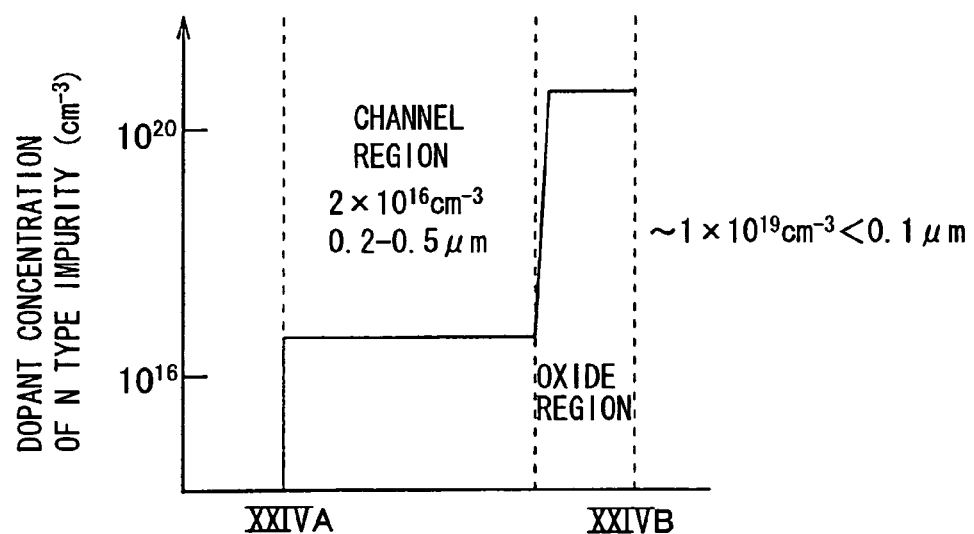
FIG. 24 is a graph showing a profile between dopant concentration of the N type impurity and thickness of a $N^-$ type channel layer and an oxide film taken along line XXIVA-XXIVB in FIG. 23.

FIG. 24 shows profiles of the film thicknesses of the N⁻ type channel layer 6 and the oxide film 8 and the dopant concentration of the N type impurities on line XXIVA-XXIVB within FIG. 23.

On line XXIVA-XXIVB within FIG. 23, the N⁻ type channel layer 6 is set to 0.2 to 0.5 μm in film thickness, and is also set to about $1 \times 10^{16}$ to $1 \times 10^{17}$ cm$^{-3}$ in impurity concentration. In this embodiment mode, as shown in FIG. 24, the impurity concentration is set to $2 \times 10^{16}$ cm$^{-3}$. The oxide film 8 is set to 0.1 μm or less in film thickness and is also set to $1 \times 10^{17}$ cm$^{-3}$ or more in impurity concentration. In this embodiment mode, as shown in FIG. 24, this impurity concentration is set to $1 \times 10^{19}$ cm$^{-3}$.

The manufacturing method of the vertical type power MOSFET of this embodiment mode will next be explained with reference to the manufacturing process views shown in FIGS. 25 to 27. The manufacturing method of the vertical type power MOSFET of this embodiment mode is also basically similar to that of the first embodiment mode.

Figure 25:
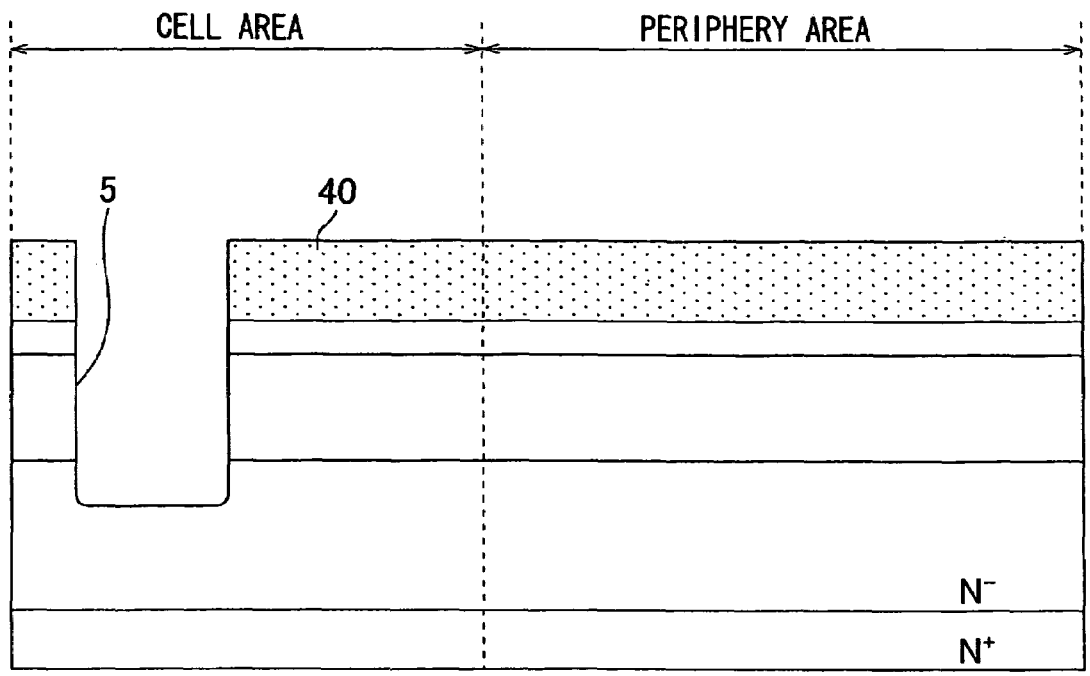
FIGS. 25-28 are cross sectional views explaining a method for manufacturing the MOSFET according to the second embodiment.

[Process Shown in FIG. 25]

A substrate shown in FIG. 3 shown in the first embodiment mode is firstly prepared. However, in this embodiment mode, the substrate having the surface of each layer set to an off plane of [11-20] is set by using the N⁺ type substrate 1 having a surface set to the off plane of [11-20]. A trench 5 is formed by performing etching using a mask 40 opened in a predetermined area for forming the trench 5.

Figure 26:
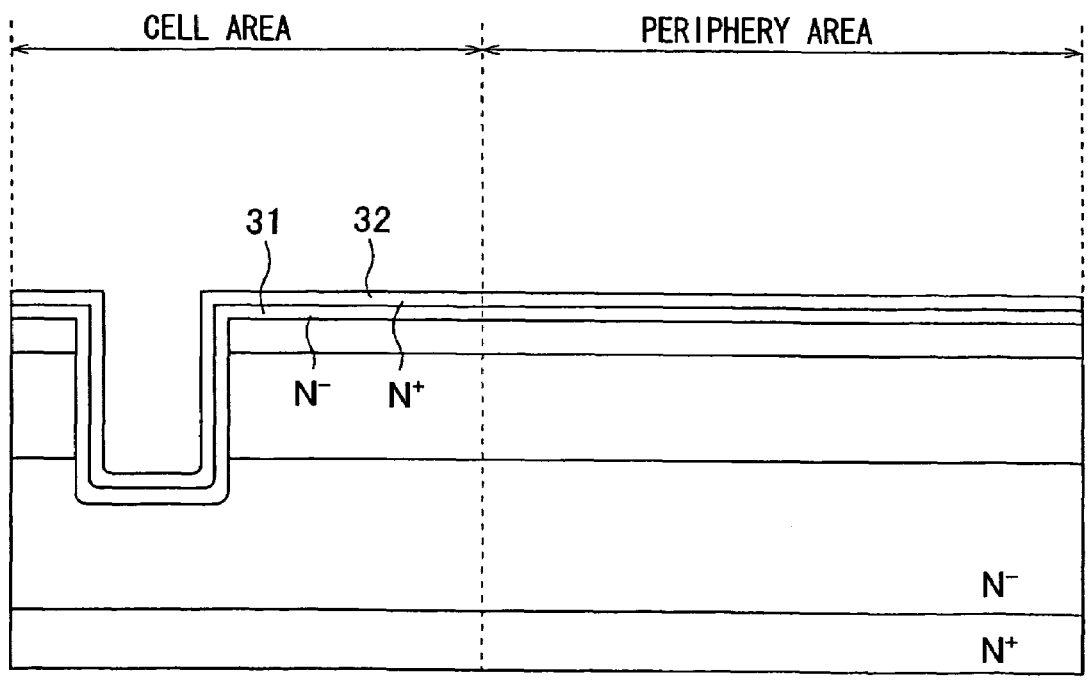

[Process Shown in FIG. 26]

After the mask 40 is removed, an N⁻ type layer 31 is formed by the CVD method and an N⁺ type layer 32 is continuously formed as it is. For example, the N⁻ type layer 31 and the N⁺ type layer 32 are formed under a condition of 1600° C. or less, 1.0 μm/h in growth rate, 1.0 or less in C/Si raw material gas introducing ratio. At this time, for example, nitrogen (N₂) is introduced into an atmosphere so as to introduce N or Al as N type impurities into the N⁻ type layer 31 and the N⁺ type layer 32.

Thus, for example, the N⁻ type layer 31 having $1 \times 10^{16}$ cm$^{-3}$ in dopant concentration and the N⁺ type layer 32 having $1 \times 10^{20}$ cm$^{-3}$ in dopant concentration are formed on the inner wall face of the trench 5.

Figure 22B:
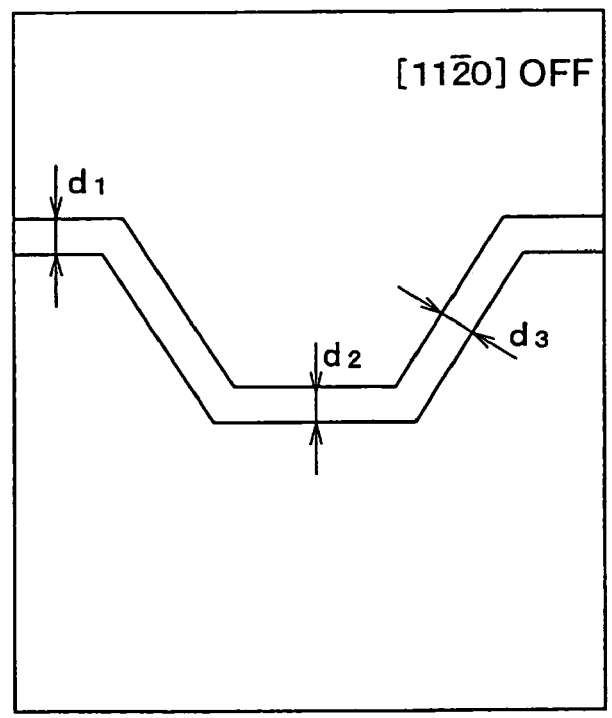

FIG. 22B shows the relation of the film thicknesses and the dopant concentrations of the N⁻ type layer 31 and the N⁺ type layer 32. When the growing condition (1600° C. or less) of this embodiment mode is adopted, the film thicknesses of the N⁻ type layer 31 and the N⁺ type layer 32 are the same and the relation of d1=d2=d3 is formed but the dopant concentrations of the N⁻ type layer 31 and the N⁺ type layer 32 are different in a structure formed on the bottom face of the trench 5, a structure formed on the side wall face, and a structure formed on the surface of the substrate. Concretely, the dopant concentration in a portion formed on the side wall face of the trench 5 within the impurity layer becomes higher than that in a portion formed on the bottom face and becomes about five times.

Figure 27:
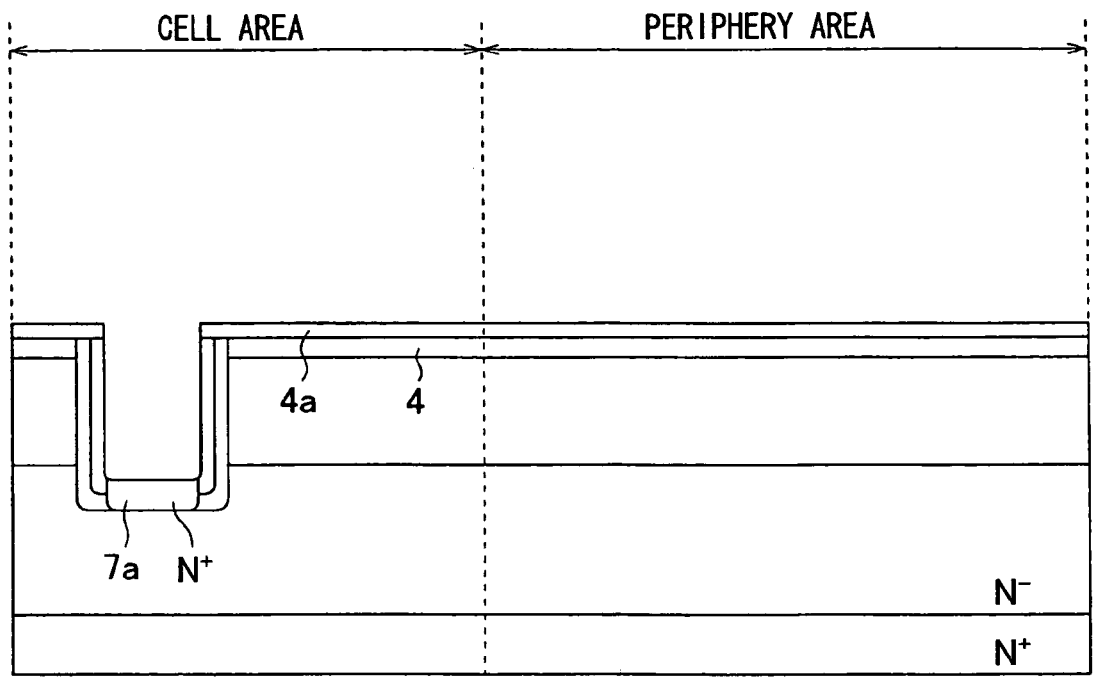

[Process Shown in FIG. 27]

A portion of the N⁻ type layer 31 and the N⁺ type layer 32 formed on the surface of the N⁺ type source area 4 is removed by etch back. Thereafter, ions of P and N as N type impurities are implanted perpendicularly onto the surface of the substrate and are added to the N⁻ type layer 31 and the N⁺ type layer 32 located on the bottom face of the trench 5, and the surface of the N⁺ type source area 4 is increased in concentration. Thus, an area 7a in the N⁺ type low resistance layer 7 and an area 4a in the N⁺ type source area 4 are formed. The area 7a formed at this time is formed by self alignment on the bottom face of the trench 5. Therefore, the area 7a is terminated in the place of an equal distance from both the side wall faces of the trench 5.

Figure 28:
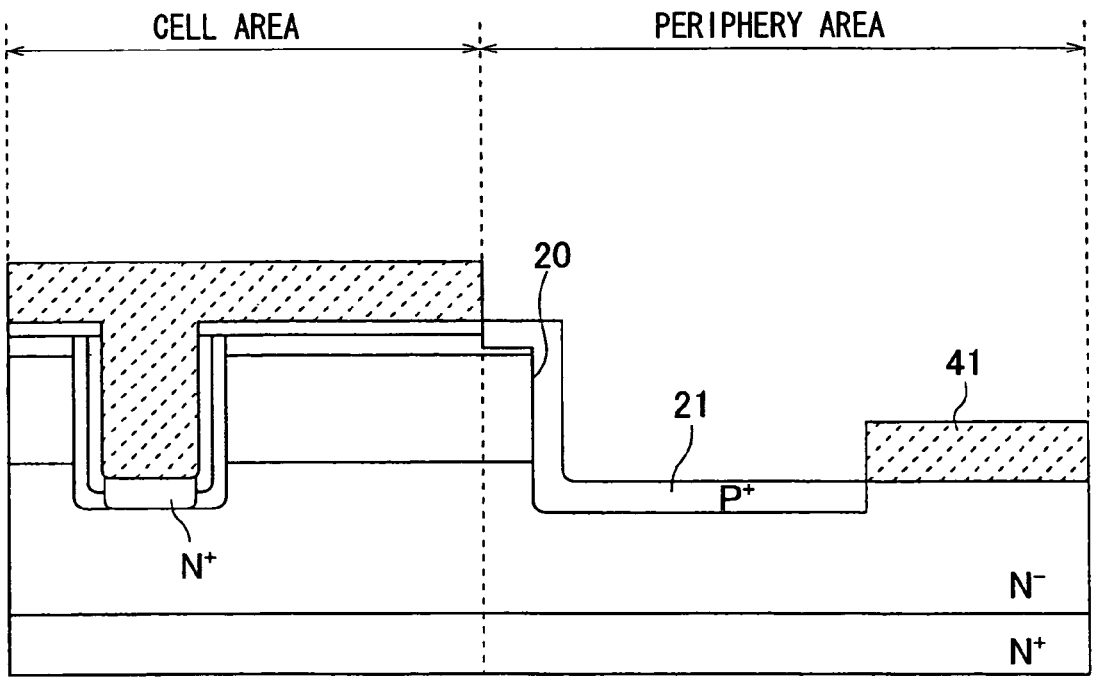

[Process Shown in FIG. 28]

A concave portion 20 is formed in an outer circumferential area by partially etching the substrate using an unillustrated mask. The mask used in the etching is then once removed. Thereafter, a mask 41 opened in only a predetermined area for forming a P⁺ type area 21 is again formed. Ions of Al or B as P type impurities are then implanted from above this mask 41. Thus, the P⁺ type area 21 is formed.

Thereafter, the vertical type power MOSFET of this embodiment mode shown in FIG. 23 is completed by a procedure similar to that of the manufacturing processes of FIG. 8 and the subsequent figures shown in the first embodiment mode.

The vertical type power MOSFET of this embodiment mode explained above is constructed such that the N⁺ type low resistance layer 7 extends through the N⁻ type channel layer 6 and reaches until the N⁻ type drift layer 2. In accordance with such a construction, when a voltage is applied to the gate electrode 9, an electric current flowed through a channel region formed in the N⁺ type channel layer 6 is flowed through the N⁺ type low resistance layer 7. Thus, on-state resistance of the vertical type power MOSFET can be further reduced.

Accordingly, effects similar to those of the first embodiment mode are obtained and it is possible to set the vertical type power MOSFET further reduced in on-resistance.

Figure 29:
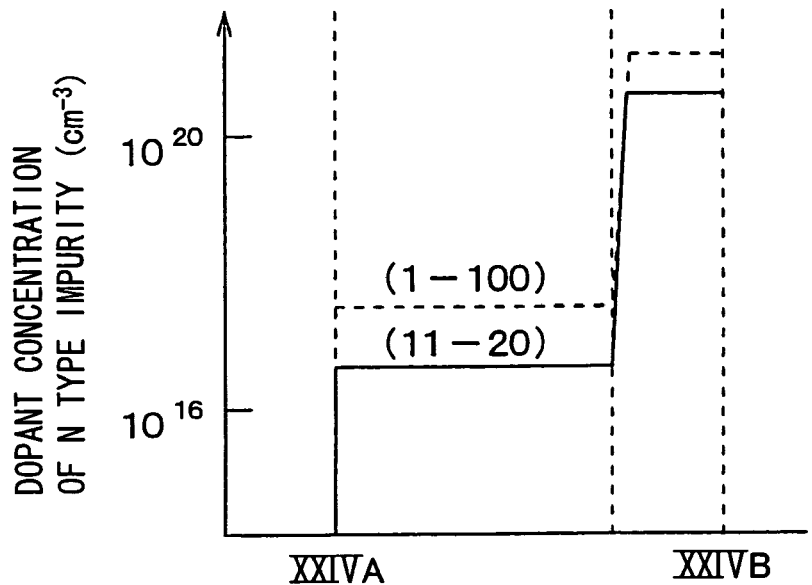
FIG. 29 is a graph explaining crystal orientation dependency of the profile between dopant concentration of the N type impurity and thickness of the N⁻ type channel layer and the oxide film taken along line XXIVA-XXIVB in FIG. 23.

When the N⁺ type substrate 1 having the surface set to the off plane of [11-20] is used as in this embodiment mode, a plane of (1-100) can be also selected in addition to the above plane of (11-20) as a plane orientation of the side wall face of the trench 5. In this case, as shown in FIG. 29, the dopant concentration of the N type impurities is raised in comparison with the plane of (11-20) by the plane orientation dependence of the N type impurities doped to the N⁻ type channel layer 6 and the oxide film 8.

Third Embodiment Mode

Figure 30:
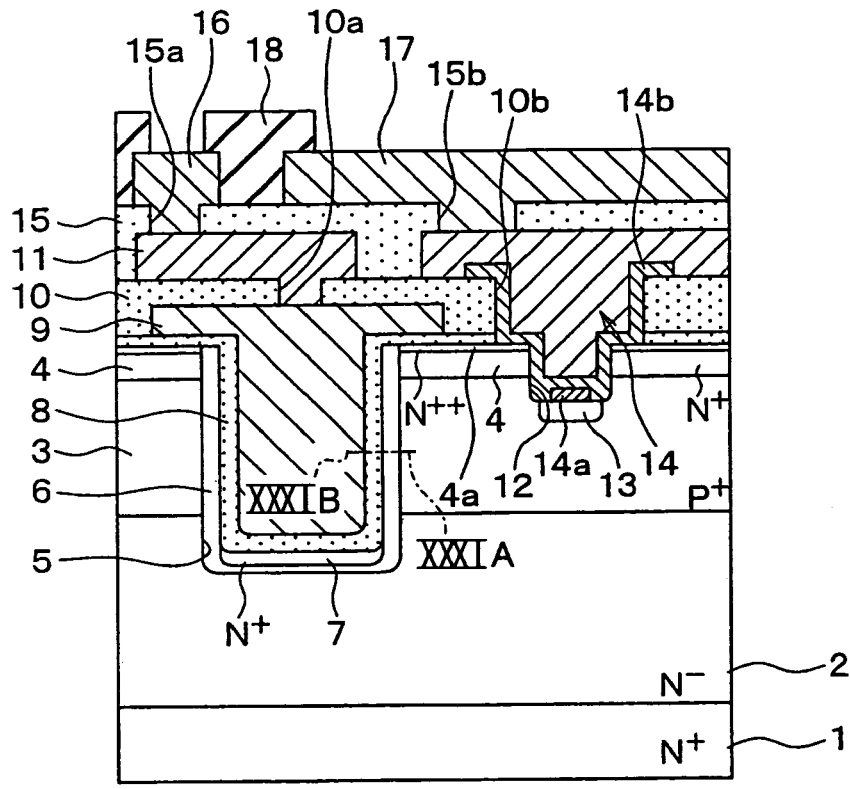
FIG. 30 is a cross sectional view showing an accumulation type vertical power MOSFET according to a third embodiment of the present invention.

A third embodiment mode of the present invention will be explained. FIG. 30 shows the sectional construction of a cell area of a vertical type power MOSFET of the trench type in this embodiment mode. The construction of the vertical type power MOSFET of this embodiment mode will next be explained with reference to FIG. 30. However, the basic construction of the third embodiment mode is similar to that of the above second embodiment mode.

As shown in FIG. 30, the sectional structure of the vertical type power MOSFET of this embodiment mode is similar to that of the vertical type power MOSFET of the second embodiment mode. However, N type impurities, P type impurities, or a SiC raw material not set to impurities is implanted as atoms into the oxide film 8.

Figure 31:
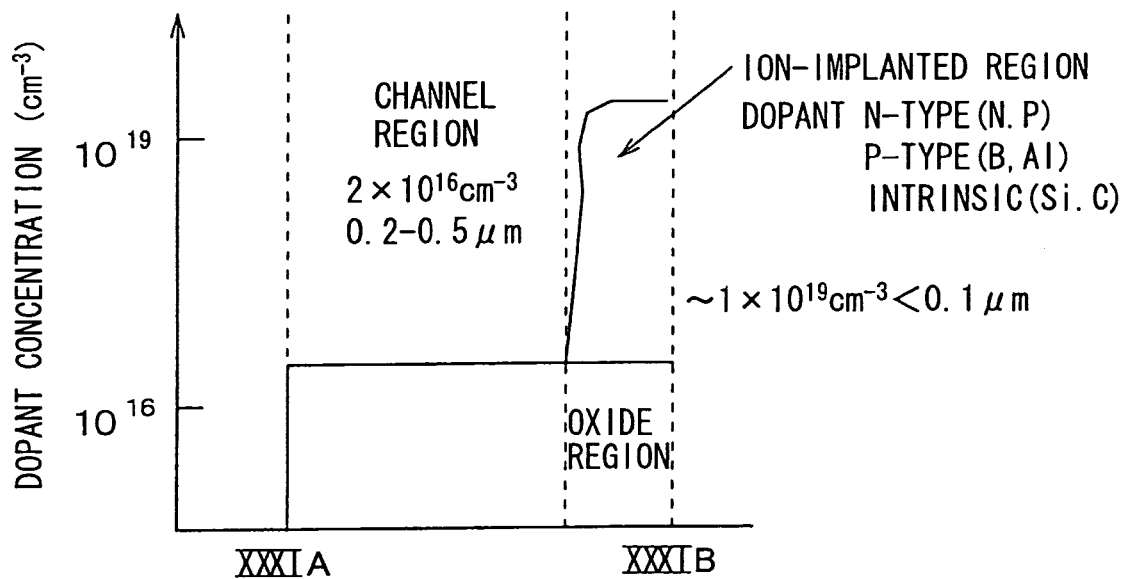
FIG. 31 is a graph showing a profile between dopant concentration of the N type impurity and thickness of the N⁻ type channel layer and the oxide film taken along line XXXIA-XXXIB in FIG. 30.

FIG. 31 shows profiles of the film thicknesses of the N⁻ type channel layer 6 and the oxide film 8 and the dopant concentration of the N type impurities on line XXXIA-XXXIB within FIG. 30.

On line XXXIA-XXXIB within FIG. 30, the N⁻ type channel layer 6 is set to 0.2 to 0.5 μm in film thickness and is also set to about $1\times10^{16}$ to $1\times10^{17}$ cm$^{-3}$ in impurity concentration. In this embodiment mode, the impurity concentration is set to $2\times10^{16}$ cm$^{-3}$ as shown in FIG. 31. The oxide film 8 is set to 0.1 μm in film thickness, and N type impurities, P type impurities, or the SiC raw material not set to impurities is set to $1\times10^{17}$ cm$^{-3}$ or more in the dopant concentration of atoms. In this embodiment mode, this dopant concentration is set to $1\times10^{19}$ cm$^{-3}$ as shown in FIG. 31.

The manufacturing method of the vertical type power MOSFET of this embodiment mode will next be explained with reference to the manufacturing process views shown in FIGS. 32 to 35. The manufacturing method of the vertical type power MOSFET of this embodiment mode is also basically similar to that of the first or second embodiment mode. Therefore, similar portions will be explained with reference to the first or second embodiment mode. Further, in this embodiment mode, a technique completely similar to that of the first embodiment mode can be adopted with respect to the outer circumferential area. Therefore, the manufacturing method will be explained by showing only the cell area in FIGS. 32 to 35.

Figure 32:
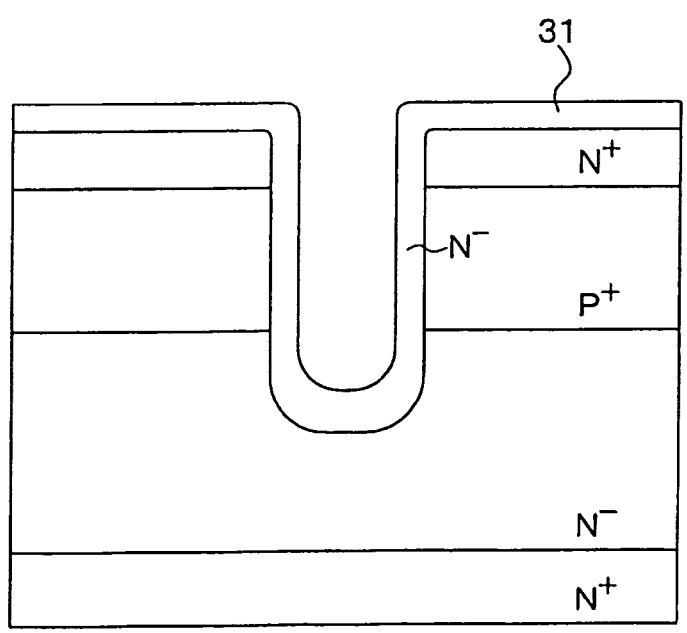
FIGS. 32-35 are cross sectional views explaining a method for manufacturing the MOSFET according to the third embodiment.

[Process Shown in FIG. 32]

A substrate shown in FIG. 3 shown in the first embodiment mode is firstly prepared. However, in this embodiment mode, the substrate having the surface of each layer set to an off plane of [11-20] is set by using the N⁺ type substrate 1 having a surface set to the off plane of [11-20]. As shown in FIG. 25 of the second embodiment mode, a trench 5 is formed by performing etching using a mask opened in a predetermined area for forming the trench 5. Thereafter, after the mask is removed, an N⁻ type layer 31 having e.g., $1\times10^{16}$ cm$^{-3}$ in dopant concentration is formed by the CVD method on the surface of the substrate.

Figure 33:
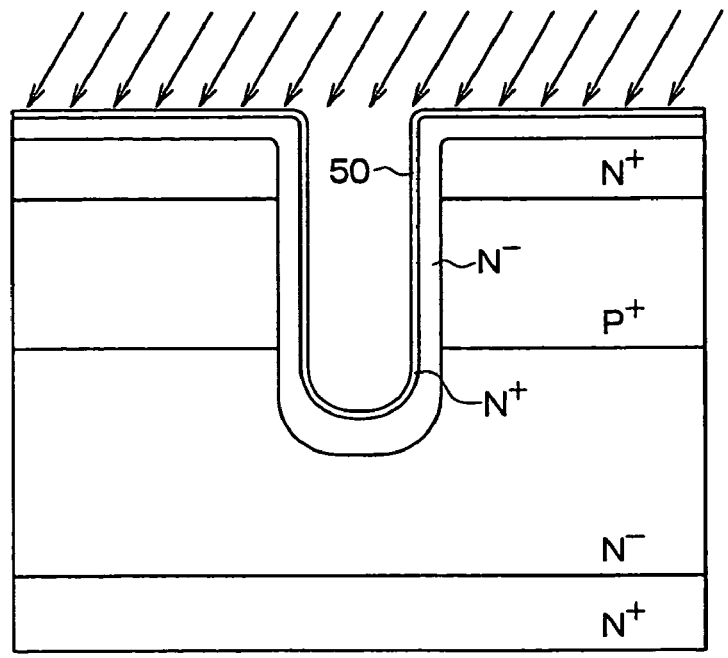

[Process Shown in FIG. 33]

An ion-implanted region 50 is formed by slantingly implanting ions from above the substrate. At this time, N type impurities, P type impurities, or atoms (Si or C) of a SiC raw material not set to impurities are used as the implanted ions, and the doping concentration is set to $1\times10^{20}$ cm$^{-3}$.

Figure 34:
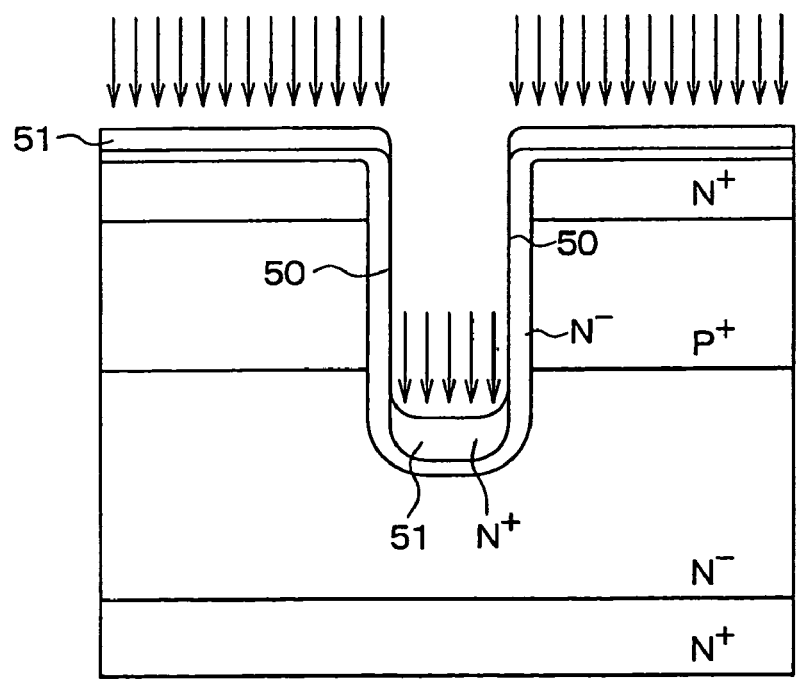

[Process Shown in FIG. 34]

Ions of N or P as the N type impurities are implanted perpendicularly to the surface of the substrate from above the substrate. Thus, the N type impurities are doped in a portion exposed from the surface of the substrate within the ion-implanted region 50 and the N⁻ type layer 31, and a portion located on the bottom face of the trench 5 so that an N type impurity area 51 is formed.

Figure 35:
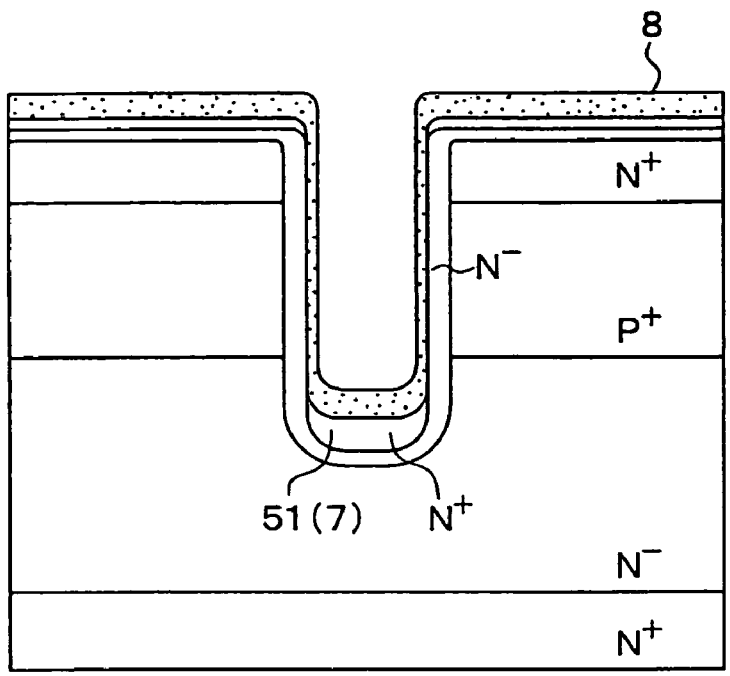

[Process Shown in FIG. 35]

After sacrifice oxidation step, etc. are performed in accordance with necessity, an oxide film 8 doped the N type impurities, the P type impurities, or atoms (Si or C) constituting the SiC raw material is formed by oxidizing the N type impurity layer 51 and the ion-implanted region 50 in the side wall of the trench 5 by thermal oxidation. The concentration of the N type impurities, the P type impurities, or the atoms (Si or C) constituting the SiC raw material doped to this oxide film 8 basically becomes the concentration of the N type impurities, the P type impurities, or the atoms (Si or C) constituting the SiC raw material included in the oxidized N type impurity layer 51 and ion-implanted region 50.

At this time, process time and process temperature of the thermal oxidation are adjusted so as to oxidize the entire ion-implanted region 50 on the side wall face of the trench 5. Thus, only the N⁻ type channel layer 6 and the oxide film 8 are left and the N⁺ type layer 32 is removed on the side wall face of the trench 5. The N type impurity layer 51 is also left on the bottom face in addition to the N⁻ type channel layer 6 and the oxide film 8. The N⁺ type low resistance layer 7 is formed by this N type impurity layer 51.

Thereafter, the vertical type power MOSFET of this embodiment mode shown in FIG. 30 is completed by a procedure similar to that of the manufacturing processes of FIG. 12 and the subsequent figures shown in the first embodiment mode.

In the vertical type power MOSFET of this embodiment mode explained above, the ion implanting layer 50 is formed on the side wall face of the trench 5 by implanting the N type impurities, the P type impurities, or the atoms (Si or C) constituting the SiC raw material into the N⁻ type layer 31 as ions. A portion functioning as a gate oxide film within the oxide film 8 is formed by oxidizing this ion implanting layer 50.

Therefore, the oxide film 8 including the N type impurities, the P type impurities, or the atoms (Si or C) constituting the SiC raw material can be formed by only the simple processes of the epitaxial growth of the N⁻ type layer 31 and the ion implantation of the N type impurities, the P type impurities, or the atoms (Si or C) constituting the SiC raw material. Thus, effects similar to those of the first embodiment mode can be obtained.

Figure 36:
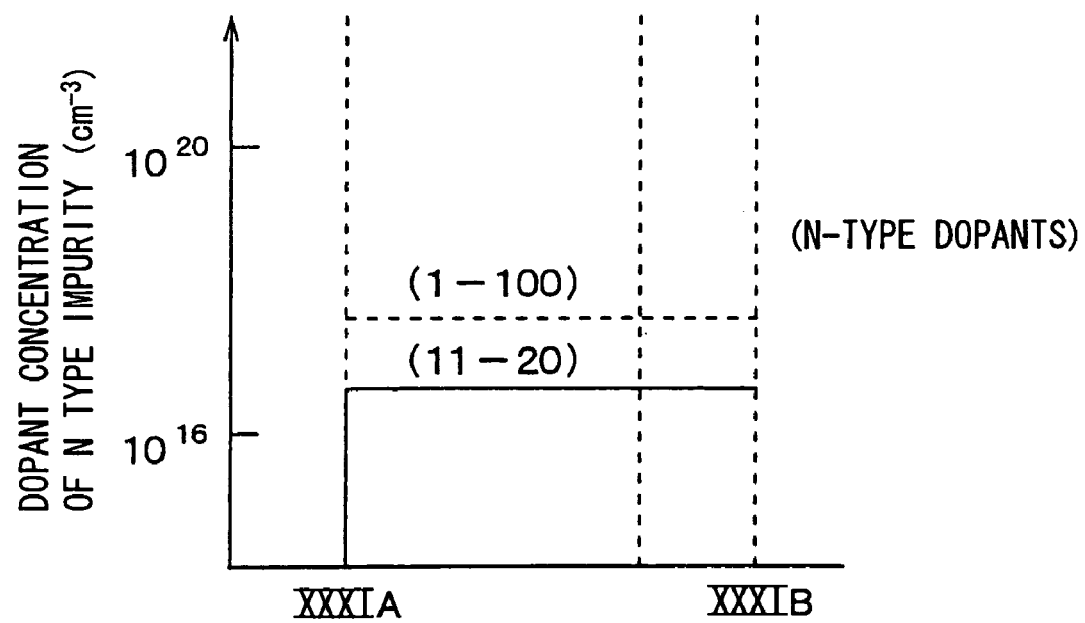
FIG. 36 is a graph explaining crystal orientation dependency of the profile between dopant concentration of the N type impurity and thickness of the N⁻ type channel layer and the oxide film taken along line XXXIA-XXXIB in FIG. 30.

When the N⁺ type substrate 1 having the surface set to the off plane of [11-20] is used as in this embodiment mode, it is also possible to select a plane of (1-100) in addition to the above plane of (11-20) as the plane orientation of the side wall face of the trench 5. In this case, as shown in FIG. 36, the dopant concentration of the N type impurities is raised in comparison with the plane of (11-20) by the plane orientation dependence of the N type impurities doped to the N⁻ type channel layer 6 and the oxide film 8. However, the dopant concentration of the N type impurities of the N⁻ type channel layer 6 and the oxide film 8 in a case using a material except for the N type impurities is shown to form the ion implanting layer 50, and the P type impurities, or the atoms (Si or C) constituting the SiC raw material are really included.

Fourth Embodiment Mode

A fourth embodiment mode of the present invention will be explained. In this embodiment mode, all impurities, etc. are doped to the N⁻ type channel layer 6, the N⁺ type low resistance layer 7 and the oxide film 8 in the vertical type power MOSFET of the structure of the third embodiment mode by the ion implantation. Accordingly, the structure of the vertical type power MOSFET of this embodiment mode is similar to the structure shown in FIG. 30 of the third embodiment mode. Further, the profiles of the film thicknesses of the N⁻ type channel layer 6 and the oxide film 8 on line XXXIA-XXXIB within FIG. 30 and the dopant concentration of the N type impurities are also approximately similar to those of FIG. 31.

The manufacturing method of the vertical type power MOSFET of this embodiment mode will next be explained with reference to the manufacturing process views shown in FIGS. 37 to 40. The manufacturing method of the vertical type power MOSFET of this embodiment mode is also basically similar to that of the third embodiment mode.

Figure 37:
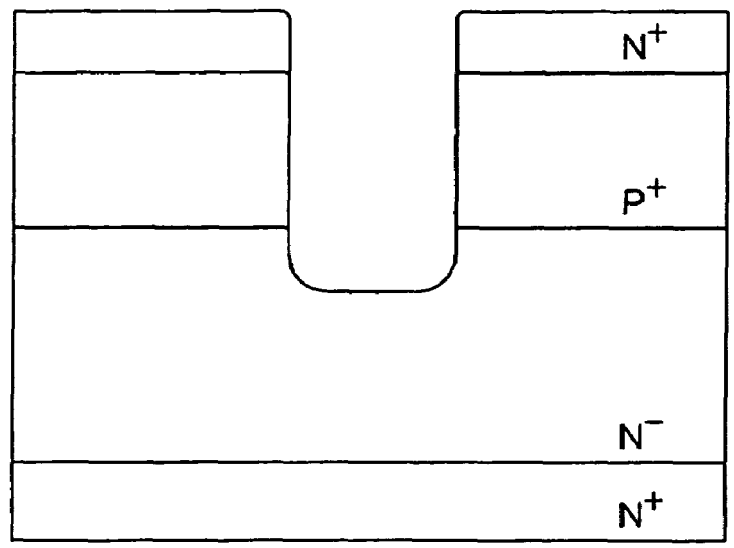
FIGS. 37-40 are cross sectional views explaining a method for manufacturing an accumulation type vertical power MOSFET according to a fourth embodiment of the present invention.

[Process Shown in FIG. 37]

Similar to the third embodiment mode, the substrate shown in FIG. 3 shown in the first embodiment mode is firstly prepared. A trench 5 is then formed by performing etching using a mask opened in a predetermined area for forming the trench 5.

Figure 38:
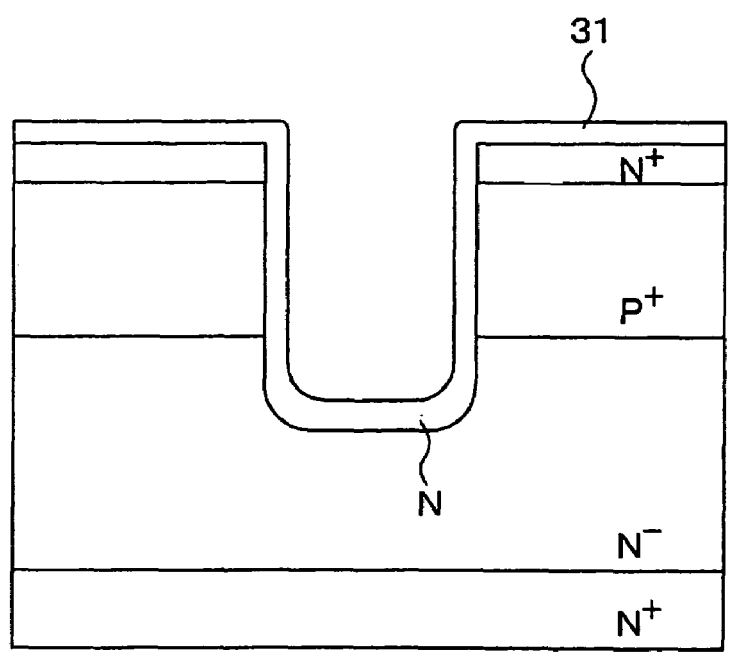

[Process Shown in FIG. 38]

After the mask used to form the trench 5 is removed, an N⁻ type layer 31 having e.g., 1×10¹⁶ cm⁻³ in dopant concentration is formed on the surface of the substrate by slantingly implanting the N type impurities as ions.

Figure 39:
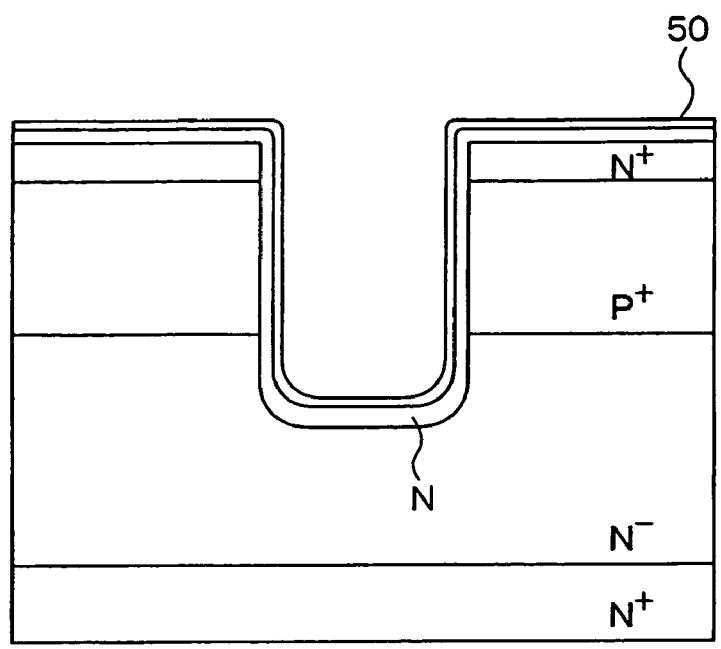

[Process Shown in FIG. 39]

An ion-implanted region 50 is formed by again slantingly implanting ions from above the substrate. At this time, the N type impurities, the P type impurities, or atoms (Si or C) in the SiC raw material not set to impurities are used as the implanted ions, and the doping concentration is set to 1×10²⁰ cm⁻³.

Figure 40:
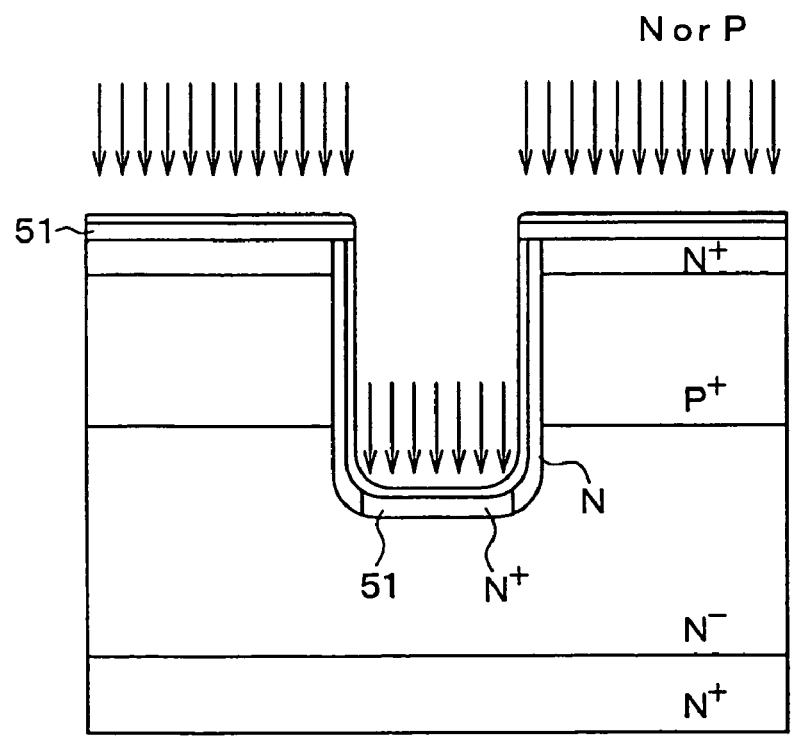

[Process Shown in FIG. 40]

Ions of N or P as the N type impurities are implanted perpendicularly to the surface of the substrate from above the substrate. Thus, the N type impurities are doped to a portion exposed from the surface of the substrate within the ion-implanted region 50 and the N⁻ type layer 31 and a portion located on the bottom face of the trench 5 so that an N type impurity area 51 is formed.

Thereafter, similar to the process shown in FIG. 35 shown in the third embodiment mode and the third embodiment mode, the vertical type power MOSFET of this embodiment mode is completed by a procedure similar to that of the manufacturing processes of FIG. 12 and the subsequent figures shown in the first embodiment mode.

In the vertical type power MOSFET of this embodiment mode explained above, the N⁻ type layer 31 is formed by implanting the N type impurities as ions into the substrate forming the trench 5 therein. Further, the ion implanting layer 50 is formed on the side wall face of the trench 5 by implanting the N type impurities, the P type impurities, or the atoms (Si or C) constituting the SiC raw material as ions. A portion functioning as a gate oxide film within the oxide film 8 is formed by oxidizing the ion implanting layer 50.

Thus, all impurities, etc. can be also doped to the N⁻ type channel layer 6, the N⁺ type low resistance layer 7 and the oxide film 8 by only the ion implantation. Effects similar to those of the third embodiment mode can be thus obtained.

Modifications

In each of the above embodiment modes, the vertical type power MOSFET of an accumulating type having the N⁻ type channel layer 6 has been explained. However, the present invention can be also applied to the vertical type power MOSFET of an inversion type having no N⁻ type channel layer 6.

Figure 41:
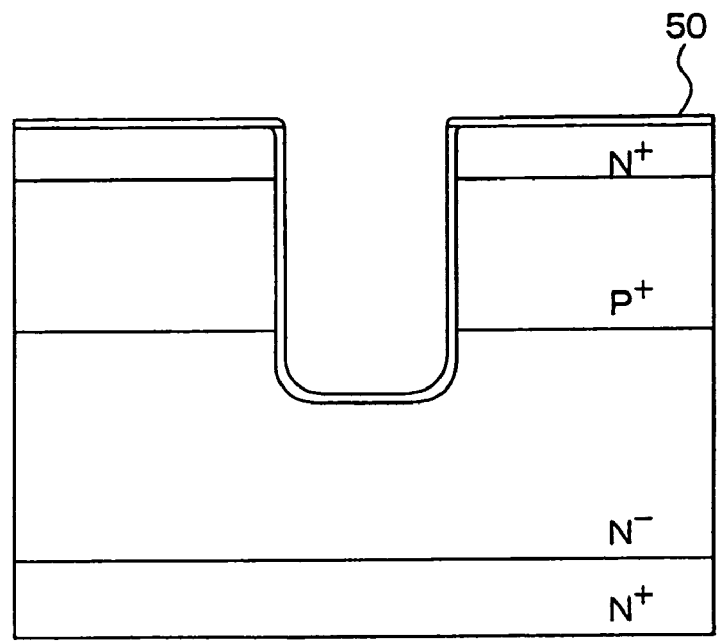
FIGS. 41-43 are cross sectional views explaining a method for manufacturing an inversion type vertical power MOSFET according to modifications of the above embodiments of the present invention.
Figure 42:
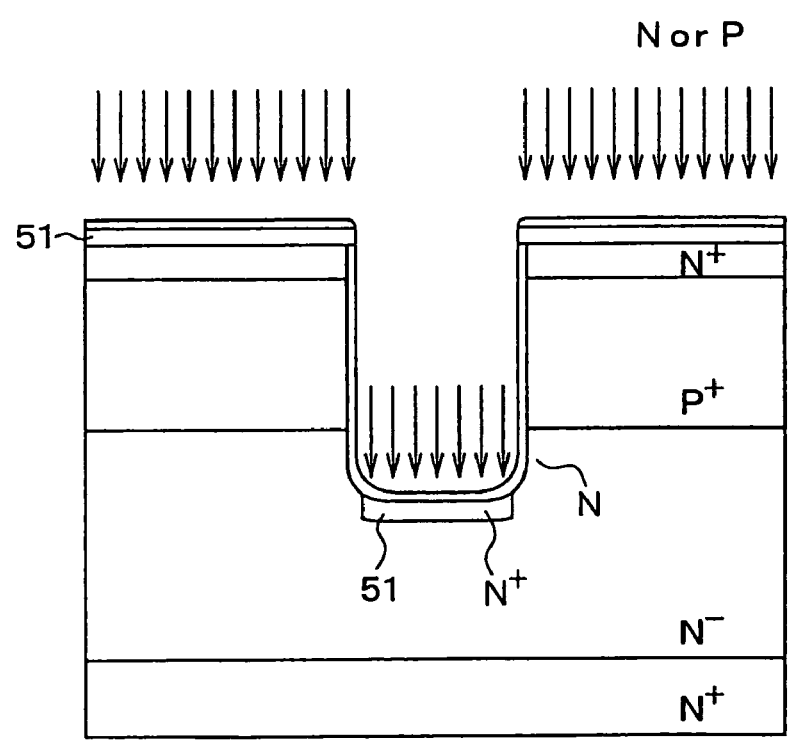
Figure 43:
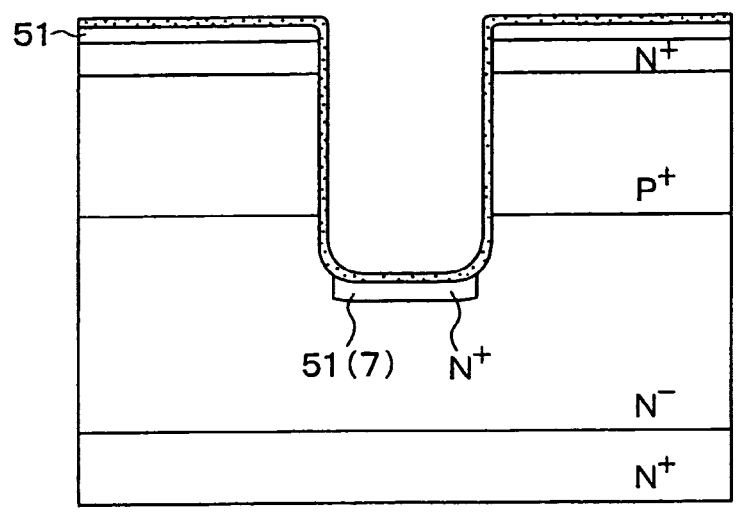
Figure 44:
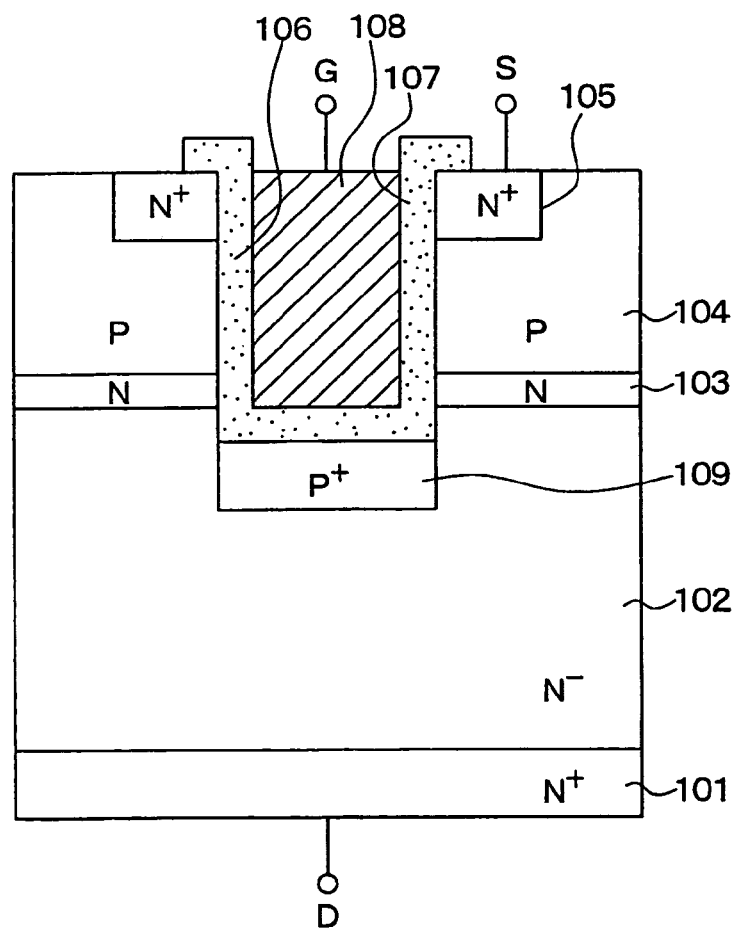
FIG. 44 is a cross sectional view showing a vertical power MOSFET according to a prior art.

One example of the manufacturing process in the case of the vertical type power MOSFET of such an inversion type is shown in FIGS. 41 to 43. The manufacturing process of the vertical type power MOSFET of the inversion type shown here shows a manufacturing process when the vertical type power MOSFET shown in the fourth embodiment mode is set to the inversion type.

Namely, after the process shown in FIG. 37 of the fourth embodiment mode is performed, an ion-implanted region 50 is formed by slantingly implanting ions as shown in FIG. 41. This corresponds to a construction for performing the process shown in FIG. 39 without performing the process shown in FIG. 38 shown in the fourth embodiment mode.

Thereafter, similar to the process shown in FIG. 40 of the fourth embodiment mode, an N type impurity area 51 is formed in the process shown in FIG. 42. Thereafter, an oxide film 8 is formed so as to perfectly oxidize a portion formed in the side wall of a trench 5 within the ion-implanted region 50 by performing thermal oxidation in the process shown in FIG. 43.

In accordance with such processes, it is also possible to manufacture the vertical type power MOSFET of the inversion type. Here, the structure for setting the vertical type power MOSFET of the accumulating type of the fourth embodiment mode to the inversion type has been shown and explained as one example of the vertical type power MOSFET of the inversion type. However, this also similarly holds true with respect to the first to third embodiment modes.

Further, in the above embodiment modes, the substrate constructed by forming the P+ type base area 3 and the N⁺ type source area 4 by the epitaxial growth is used, but these areas may be also formed by the ion implantation.

In the above embodiment modes, the vertical type power MOSFET of the N channel type for constructing a channel of the N type by setting the first conductivity type to the N type and setting the second conductivity type to the P type has been shown and explained as an example. However, the present invention can be also applied to the vertical type power MOSFET of the P channel type for constructing a channel of the P type by setting the first conductivity type to the P type and setting the second conductivity type to the N type.

Further, the N⁺ type substrate 1 is adopted, but IGBT may be also set instead of the power MOSFET by adopting the P⁺ type substrate instead of the N⁺ type substrate 1. In this case, it is also possible to set a structure for inverting the conductivity type as mentioned above.

When the orientation of a crystal is shown, a bar (−) should be originally marked on a predetermined desirable number. However, the bar is marked before the predetermined desirable number in this specification since a limit of representation based on a personal computer application exists.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a silicon carbide semiconductor device comprising the steps of:

preparing a semiconductor substrate including a silicon carbide substrate and first to third semiconductor layers, wherein the first semiconductor layer made of silicon carbide and having the first conductive type and an impurity concentration lower than that of the silicon carbide substrate, the second semiconductor layer made of silicon carbide and having the second conductive type, and the third semiconductor layer made of silicon carbide and having the first conductive type are formed on the silicon carbide substrate having a first conductive type or a second conductive type in this order;

forming a trench in a cell region of the semiconductor substrate so that the trench penetrates the second and the third semiconductor layers and reaches the first semiconductor layer;

forming a fourth semiconductor layer having the first conductive type in the trench by an epitaxial growth method;

forming an oxide film in the trench in such a manner that a part of the fourth semiconductor layer disposed on a sidewall of the trench is thermally oxidized, wherein the oxide film includes a part for functioning as a gate oxide film;

forming a gate electrode on a surface of the oxide film in the trench;

forming a first electrode electrically connecting to the third semiconductor layer; and forming a second electrode electrically connecting to the silicon carbide substrate.

2. The method according to claim 1, wherein
the sidewall of the trench has a surface orientation of (1-100) or (11-20), and
a part of the fourth semiconductor layer disposed on a bottom of the trench has a thickness larger than that of a part of the fourth semiconductor layer disposed on the sidewall of the trench.

3. The method according to claim 2, wherein
the thickness of the part of the fourth semiconductor layer disposed on the bottom of the trench is three times larger than that of the part of the fourth semiconductor layer disposed on the sidewall of the trench.

4. The method according to claim 2, wherein
in the step of forming the oxide film, a part of the fourth semiconductor layer disposed on a lower side of a bottom of the trench remains without thermal oxidation so that the part of the fourth semiconductor layer provides a low resistance layer.

5. The method according to claim 1, wherein
the fourth semiconductor layer has an impurity concentration of a first conductive type impurity is in a range between $1 \times 10^{17}$ cm$^{-3}$ and $1 \times 10^{19}$ cm$^{-3}$.

6. The method according to claim 1, further comprising the step of:
forming a fifth semiconductor layer having the first conductive type on an inner wall of the trench by an epitaxial growth method, wherein
the fifth semiconductor layer functions as a channel layer,
in the step of forming the fourth semiconductor layer, the fourth semiconductor layer is formed on the fifth semiconductor layer, and
an impurity concentration of the first conductive type impurity in the fourth semiconductor layer is higher than that in the fifth semiconductor layer.

7. The method according to claim 6, wherein
the semiconductor substrate further includes a periphery area,
in the step of forming the trench, a concavity is formed in the periphery area to penetrate the second and the third semiconductor layers and to reach the first semiconductor layer,
in the step of forming the fifth semiconductor layer, the fifth semiconductor layer is formed in the concavity,
in the step of forming the fourth semiconductor layer, the fourth semiconductor layer is formed on a surface of the fifth semiconductor layer in the concavity, and
the method further comprising the step of:
forming a second conductive type region in such a manner that the cell region is covered with a mask, and a second conductive type impurity is introduced by an ion implantation method into a part of the fourth and the fifth semiconductor layers disposed in the concavity on a cell region side.

8. A method for manufacturing a silicon carbide semiconductor device comprising the steps of:
preparing a semiconductor substrate including a silicon carbide substrate and first to third semiconductor layers, wherein the first semiconductor layer made of silicon carbide and having the first conductive type and an impurity concentration lower than that of the silicon carbide substrate, the second semiconductor layer made of silicon carbide and having the second conductive type, and the third semiconductor layer made of silicon carbide and having the first conductive type are formed on the silicon carbide substrate having a first conductive type or a second conductive type in this order;

forming a trench in a cell region of the semiconductor substrate so that the trench penetrates the second and the third semiconductor layers and reaches the first semiconductor layer;

forming a fourth semiconductor layer having the first conductive type in the trench by an epitaxial growth method, wherein a part of the fourth semiconductor layer disposed on a sidewall of the trench has a thickness substantially equal to a thickness of a part of the fourth semiconductor layer disposed on a bottom of the trench;

forming a low resistance layer in such a manner that a first conductive type impurity is introduced from an upper side of the semiconductor substrate by an ion implantation method so that the first conductive type impurity is doped through the fourth semiconductor layer on the bottom of the trench;

forming an oxide film in the trench in such a manner that a part of the fourth semiconductor layer disposed on the sidewall of the trench is thermally oxidized, wherein the oxide film includes a part for functioning as a gate oxide film;

forming a gate electrode on a surface of the oxide film in the trench;

forming a first electrode electrically connecting to the third semiconductor layer; and forming a second electrode electrically connecting to the silicon carbide substrate.

9. The method according to claim 8, wherein
in the step of forming the oxide film, the low resistance layer disposed under the fourth semiconductor layer on the bottom of the trench remains without thermal oxidation.

10. The method according to claim 8, wherein
the fourth semiconductor layer has an impurity concentration of the first conductive type impurity is in a range between $1 \times 10^{17}$ cm$^{-3}$ and $1 \times 10^{19}$ cm$^{-3}$.

11. The method according to claim 8, further comprising the step of:
forming a fifth semiconductor layer having the first conductive type on an inner wall of the trench by an epitaxial growth method, wherein
the fifth semiconductor layer functions as a channel layer,
in the step of forming the fourth semiconductor layer, the fourth semiconductor layer is formed on the fifth semiconductor layer, and
an impurity concentration of the first conductive type impurity in the fourth semiconductor layer is higher than that in the fifth semiconductor layer.

12. The method according to claim 11, wherein
the semiconductor substrate further includes a periphery area,
in the step of forming the trench, a concavity is formed in the periphery area to penetrate the second and the third semiconductor layers and to reach the first semiconductor layer,
in the step of forming the fifth semiconductor layer, the fifth semiconductor layer is formed in the concavity,
in the step of forming the fourth semiconductor layer, the fourth semiconductor layer is formed on a surface of the fifth semiconductor layer in the concavity, and
the method further comprising the step of:
forming a second conductive type region in such a manner that the cell region is covered with a mask, and a second conductive type impurity is introduced by an ion implantation method into a part of the fourth and the fifth semiconductor layers disposed in the concavity on a cell region side.

13. A method for manufacturing a silicon carbide semiconductor device comprising the steps of:

preparing a semiconductor substrate including a silicon carbide substrate and first to third semiconductor layers, wherein the first semiconductor layer made of silicon carbide and having the first conductive type and an impurity concentration lower than that of the silicon carbide substrate, the second semiconductor layer made of silicon carbide and having the second conductive type, and the third semiconductor layer made of silicon carbide and having the first conductive type are formed on the silicon carbide substrate having a first conductive type or a second conductive type in this order;

forming a trench in a cell region of the semiconductor substrate so that the trench penetrates the second and the third semiconductor layers and reaches the first semiconductor layer;

forming an ion implantation region on an inner wall including a sidewall of the trench in such a manner that a first conductive type impurity, a second conductive type impurity, a silicon atom or a carbon atom is implanted slantwise on the semiconductor substrate;

forming an oxide film in the trench in such a manner that a part of the ion implantation region disposed on the sidewall of the trench is thermally oxidized, wherein the oxide film includes a part for functioning as a gate oxide film;

forming a gate electrode on a surface of the oxide film in the trench;

forming a first electrode electrically connecting to the third semiconductor layer; and forming a second electrode electrically connecting to the silicon carbide substrate.

14. The method according to claim 13, further comprising the step of:

forming a first conductive type region disposed on the bottom of the trench in such a manner that the first conductive type impurity is implanted from an upper side of the semiconductor substrate, wherein the first conductive type region is deeper than the ion implantation region, and in the step of forming the oxide film, a part of the first conductive type region disposed on a lower side of the bottom of the trench remains without thermal oxidation so that the part of the first conductive type region provides a low resistance layer.

15. The method according to claim 13, further comprising the step of:

forming a fourth semiconductor layer having the first conductive type on an inner wall of the trench by an epitaxial growth method, wherein the fourth semiconductor layer functions as a channel layer, and in the step of forming the ion implantation layer, the first conductive type impurity, the second conductive type impurity, the silicon atom or the carbon atom is implanted into the fourth semiconductor layer so that the ion implantation layer is provided.

16. The method according to claim 13, further comprising the step of:

forming a fourth semiconductor layer having the first conductive type in such a manner that a first conductive type impurity is implanted on an inner wall of the trench, wherein the fourth semiconductor layer functions as a channel layer, and in the step of forming the ion implantation layer, the first conductive type impurity, the second conductive type impurity, the silicon atom or the carbon atom is implanted into the fourth semiconductor layer so that the ion implantation layer is provided.

* * * * *